(12) United States Patent
Yap et al.

(10) Patent No.: US 7,928,389 B1
(45) Date of Patent: Apr. 19, 2011

(54) WIDE BANDWIDTH INFRARED DETECTOR AND IMAGER

(75) Inventors: Daniel Yap, Newbury Park, CA (US);
Rajesh D. Rajavel, Oak Park, CA (US);
Sarabjit Mehta, Calabasas, CA (US);
Joseph S. Colburn, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 8 days.

(21) Appl. No.: 12/544,788

(22) Filed: Aug. 20, 2009

(51) Int. Cl.
*H01L 31/0236* (2006.01)

(52) U.S. Cl. .................................................. 250/338.4

(58) Field of Classification Search .................. 250/330, 250/332, 336.1, 338.1, 338.4, 339.01, 339.02; 136/243, 244, 252, 253
See application file for complete search history.

(56) References Cited

U.S. PATENT DOCUMENTS

| | | | |
|---|---|---|---|
| 4,183,035 A * | 1/1980 | Wang et al. ................ 257/188 |
| 4,496,788 A | 1/1985 | Hamakawa et al. | |
| 4,675,525 A * | 6/1987 | Amingual et al. ......... 250/338.1 |
| 5,080,725 A * | 1/1992 | Green et al. ................. 136/256 |
| 5,239,179 A * | 8/1993 | Baker ......................... 250/338.4 |
| 5,581,084 A * | 12/1996 | Chapman et al. .......... 250/338.4 |
| 5,721,429 A * | 2/1998 | Radford et al. ............ 250/338.4 |
| 5,963,790 A * | 10/1999 | Matsuno et al. .............. 438/72 |
| 6,294,723 B2 | 9/2001 | Uematsu et al. | |
| 6,545,289 B1 * | 4/2003 | Gunapala et al. .............. 257/21 |
| 6,852,920 B2 | 2/2005 | Sager et al. | |
| 6,858,462 B2 | 2/2005 | Zaidi et al. | |
| 7,545,051 B2 | 6/2009 | Yang et al. | |
| 2002/0135869 A1 * | 9/2002 | Banish et al. ................ 359/350 |
| 2004/0045932 A1 | 3/2004 | Kochergin et al. | |
| 2005/0109388 A1 | 5/2005 | Murakami et al. | |
| 2006/0251995 A1 | 11/2006 | Wille et al. | |
| 2008/0072958 A1 * | 3/2008 | Dutta ............................ 136/256 |

FOREIGN PATENT DOCUMENTS

JP    05259427 A    * 10/1993

OTHER PUBLICATIONS

Tokranova, N., et al., "Hybrid Solar Cells Based on Organic Materials Embedded Into Porous Silicon," Proc. SPIE, 5724, 183-190 (2005).
Technical Information document (SD-12), Characteristics and use of infrared detectors, by Hamamatsu Photonics K. K, pp. 1-43 (2004).
A. Rogalski (Journal of Applied Physics, vol. 93, No. 8, 15, pp. 4355-4391 (2003).
Green, M.A., et al. , "Very High Efficiency Silicon Solar Cells—Science and Technology," IEEE Transactions on Electron Devices, vol. 46, No. 10, pp. 1940-1947 (1999).

(Continued)

*Primary Examiner* — David P Porta
*Assistant Examiner* — Marcus H Taningco
(74) *Attorney, Agent, or Firm* — Janus Law Group

(57) ABSTRACT

An apparatus and method for a detector are disclosed. The apparatus disclosed contains an extractor layer, an absorber layer disposed adjacent to the extractor layer, a first electrical contact and a second electrical contact. The absorber layer is configured to absorb photons of incident light and generate minority electrical carriers and majority electrical carriers. In the disclosed apparatus, the top surface of the absorber layer is shaped as a pyramid, the extractor layer is electrically connected with the absorber layer and with the first electrical contact for extracting the minority electrical carriers, and the absorber layer is electrically connected with the extractor layer and with the second electrical contact to extract the majority electrical carriers.

29 Claims, 20 Drawing Sheets

OTHER PUBLICATIONS

Campbell, P., et al., "Light Trapping Properties of Pyramidally Textured Surfaces," J. Appl. Phys., vol. 62.1, American Institute of Physics, pp. 243-249 (1987).

Brendel, R., et al.,"Ultrathin crystalline silicon solar cells on glass substrates," Applied Physics Letters, vol. 70, No. 3, pp. 390-392 (1997).

Swanson, R. M., et al. "Point-contact silicon solar cells," IEEE Transactions on Electron Devices, vol. ED-31, No. 5, pp. 661-664 (1984).

Sinton, R.A., et al., "27.5 percent silicon concentrator solar cells," IEEE Electron Device Letters, vol. EDL-7 No. 10, pp. 567-569 (1986).

Yuan, H.,et al., "FPA Development: from InGaAs, InSb to HgCdTe," Proceedings of SPIE vol. 6940, paper 69403C, (2008).

Ashley, T., et al., "Epitaxial InSb for elevated temperature operation of large IR focal plane arrays," Proceedings of SPIE vol. 5074, pp. 95-102 2003).

Zhao,, et al. "A 19.8% efficiency honeycomb multicrystalline silicon solar cell with . . . ," IEEE Transactions on Electron Devices, vol. 46, No. 10, pp. 1978-1983 (1999).

Kayes, B. M., et al., "Comparison of the device physics principles of planar and radial p-n. junction nanorod . . . " J. Appl. Physics, vol. 97, pp. 114302 (2005).

Hu, L.,, et al., "Analysis of Optical Absorption in Silicon Nanorwire Arrays for Photovoltaic Applications," Nano Letters, vol. 7, No. 11, p. 3249 (2007).

Klipstein, P., "XBn barrier photodetector for high sensitivity and high operating temperature infrared . . . ," Proceedings of SPIE, vol. 6940, paper 69402U-1 (2008).

* cited by examiner

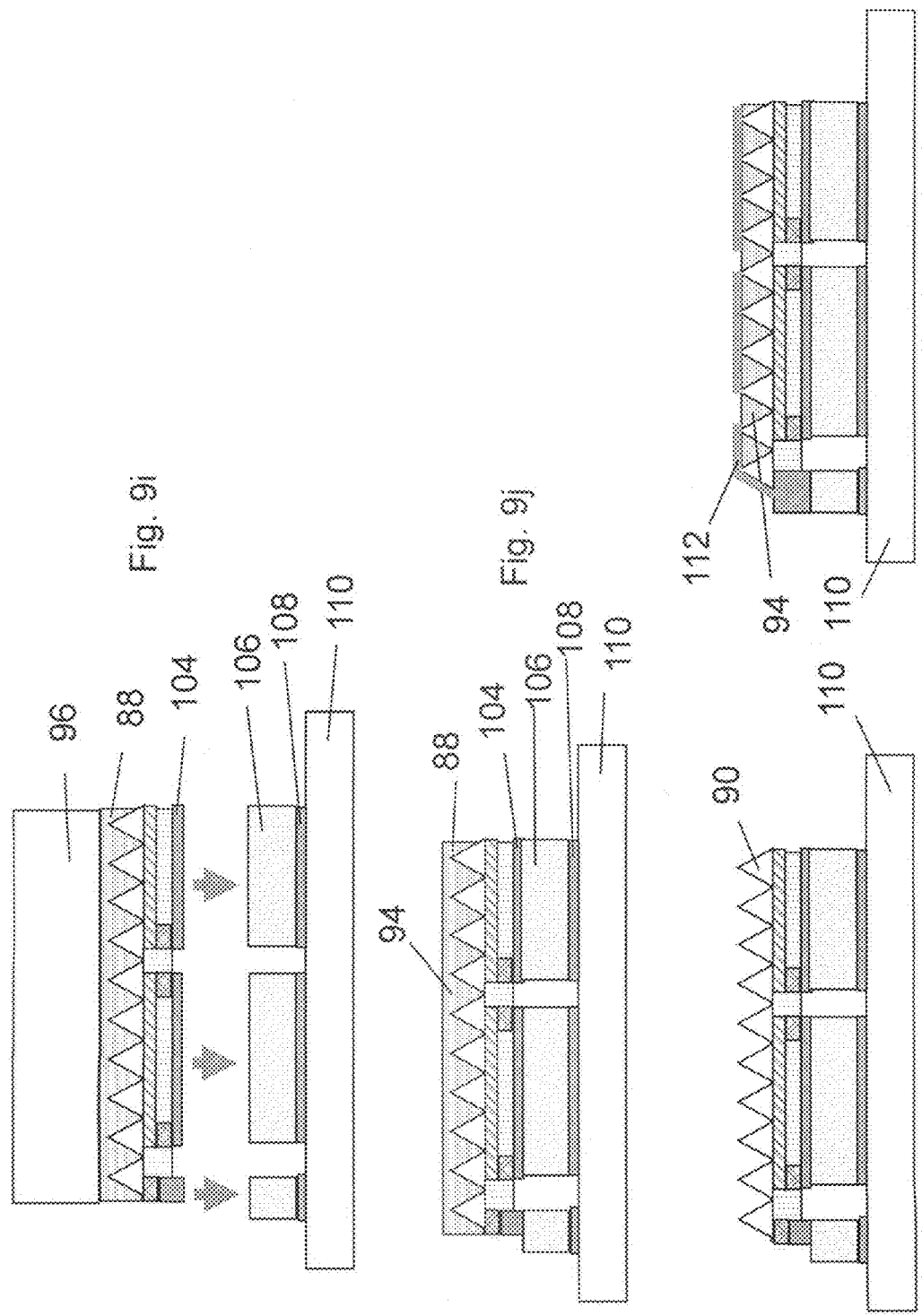

Pyramid height: 5 um
Pyramid base: 4.4 um
Cell pitch: 5 um

WIDE BANDWIDTH INFRARED DETECTOR AND IMAGER

This application is related to co-pending application U.S. application Ser. No. 12/544,221, filed on the same date as the present application, for "Reduced Volume Infrared Detector" by Daniel Yap, Rajesh D. Rajavel, Sarabjit Mehta and James H. Schaffner, the disclosure of which is incorporated herein by reference in its entirety. This application is also related to co-pending application U.S. Application Serial No. 12/544,687, filed on the same date as the present application, for "Honeycomb Infrared Detector" by Daniel Yap and James H. Schaffner, the disclosure of which is incorporated herein by reference in its entirety.

FIELD

The present disclosure relates generally to photon detectors.

BACKGROUND AND PRIOR ART

According to prior art, optical quantum detectors (which absorb incident photons and generate electrical charge carriers) generally have highest sensitivity over a fairly small bandwidth, generally one octave or less. Contrary to the present disclosure, prior art detectors, used in optical imagers, generally make use of an optical anti-reflective coating to increase the amount of incident light that is coupled into their light-absorbing material.

Prior art infrared detectors are described in a Technical Information document (SD-12) by Hamamatsu Photonics K. K. Examples of prior photovoltaic and photoconducting detectors that have sensitivity in MWIR and/or LWIR wavelengths are described in an article by A. Rogalski (Journal of Applied Physics, vol. 93, no. 8, 15 Apr. 2003, pp. 4355-4391). In general, these detectors are formed as 2-dimensional arrays of detector pixels that are connected physically and electrically to a silicon read-out integrated circuit (ROIC). Photovoltaic detectors typically contain P-type semiconductor material, N-type semiconductor material and a PN junction. The incident light can be absorbed primarily in the P-type material, primarily in the N-type material or in substantially both P-type and N-type materials.

As depicted in FIGS. 1a-1d, prior infrared detectors 20, 22 and 24 often comprise a substrate 10 on which the array of detector pixels 12 is formed. The incident light 14 illuminates the substrate 10 and passes through the optically transparent substrate 10 to the detector pixels 12, as depicted in FIG. 1a. For these detectors, each detector pixel 12 may be located on the side of the substrate 10 that faces the ROIC 18 and may be connected to the ROIC 18 by means of a solder bump 16, depicted in FIGS. 1b and 1d. With the detectors 20 and 22, the substrate 10 is generally not removed and individual pixels 12 are defined by etching mesa structures that include the PN junction of a detector pixel 12. For detector 24, illustrated in FIG. 1c, which comprise a thick film of the light-absorbing material 30, electrical vias 28 are etched through the absorbing film 30 and a PN junction 32 is formed around each of the vias 28. Metal 34 is then coated over the vias 28 and provide electrical connections between the PN junctions 32 and the ROIC 18. According to prior art, detectors 20, 22 and 24 can be coated with an anti-reflecting film to improve the capture of the light 14. The anti-reflecting film is normally composed of one or more quarter-wave thickness layers of material that have a value for its refractive index that is between the value of the refractive index of the incident medium (such as air) and the refractive index of the substrate 14.

According to prior art, the infrared detectors 20, 22 and 24 can achieve high external quantum efficiency only over a limited optical bandwidth because of their anti-reflective coatings. Because a quarter-wave thickness is achieved exactly for only one specific wavelength of the incident light, the anti-reflective coating is effective for only a small band of wavelengths (nominally less than an octave).

To achieve high internal quantum efficiency, the light-absorbing layer (or layers) of infrared detectors in the prior art must have a thickness that is sufficiently large to permit enough of the incident light, coupled in through its front surface, which typically is the back side of the absorber, to be absorbed. In fact, the thickness of the absorber must be sufficient to absorb light at the longest wavelength of its desired band of operation. For high efficiency, that thickness is typically several times the value of the longest wavelength of the band, even when the detector has a metal reflector at its back side (the side facing away from the incident light) that enables the overall path-length of the light through the absorber to be doubled. Noisy "dark" current can be generated in the volume of the absorber because of thermal generation of electrical carriers. Thus, having a thick absorber means that the total volume of material contributing to the dark current is large, and the dark current is high. This degrades the detectivity of the detectors 20, 22 and 24. In contrast, a novel infrared detector (imager) presently disclosed, does not require an anti-reflecting film and it provides low reflection for incident light over a large bandwidth of multiple octaves with reduced dark current.

Like optical quantum detectors, solar cells have also been developed to absorb light, however at visible wavelengths. And, solar cells generally do not absorb light at MWIR wavelengths. Solar cells are generally made from material such as silicon. Although both solar cells and infrared imagers have been widely used commercial products for several decades, there does not appear to be any known attempts to combine the features of these two kinds of devices.

Surfaces with shallow pyramid-shaped features and the light trapping benefits of such surfaces are known from the field of solar cells. An article by M. A. Green, et al. ("Very High Efficiency Silicon Solar Cells—Science and Technology", IEEE Transactions on Electron Devices, vol. 46, no. 13, October 1999, pp. 1940-1947) describes solar cells that contain pyramid-shaped surfaces. The light trapping properties of pyramidally textured surfaces is described in an article by P. Campbell and M. A. Green (Journal of Applied Physics, vol. 62, no. 1, 1 Jul. 1987, pp. 243-249). Prior art solar cell 38, depicted in FIG. 2, has pyramids 40 with height that are small compared to the overall thickness of the light-absorbing material 42. This is because for solar cells, the dark current noise is not a problem of concern. In contrast, in the infrared imager presently disclosed, the height of the pyramid is large compared to the overall thickness of the light absorbing material, with that pyramid height being about one half of the overall thickness of the light absorbing material.

Another prior art solar cell 44, depicted in FIG. 3, has pyramids 46 whose height is large compared to the overall thickness of the light absorbing material 48. This solar cell is described in an article by R. Brendel, et al. ("Ultrathin crystalline silicon solar cells on glass substrates," Applied Physics Letters, vol. 70, no. 3, 20 Jan. 1997, pp. 390-392). In the solar cell 44, the PN junctions 50 are located near the sloped faces or sidewalk at the backside of the device. In contrast, for some embodiments of the present invention, the PN junctions may be located near the tips of the pyramid structures at the backside of the device. This allows the infrared imager presently disclosed to achieve reduced area of the junction depletion regions, thereby reducing the dark current from those depletion regions.

Another prior art solar cell with back-side electrical contacts whose PN junction area is small is described in an article by R. M. Swanson, et al. ("Point-contact silicon solar cells," IEEE Transactions on Electron Devices, vol. ED-31, no. 5, May 1984, pp. 661-664). Solar cells having localized PN junctions at their back side as wells as pyramid-shaped texturing of their front side are depicted in FIG. 4 and are described in an article by R. A. Sinton, et al. (27.5 percent silicon concentrator solar cells," IEEE Electron Device Letters, vol. EDL-7 no. 10, October 1986, pp. 567-569). Diffusion of the doped regions to create such PN junctions involves subjecting the material to fairly high temperatures, generally >400 degrees-C., and may be incompatible with the processes involved in fabricating devices that have thin light absorbing material:

A novel infrared detector (imager) with low reflection for incident light over a large bandwidth of multiple octaves and with reduced dark current is presently disclosed.

BRIEF DESCRIPTION OF THE FIGURES

FIG. 5b depicts pyramidal absorber that lines the walls of the anechoic chamber of FIG. 5a.

FIGS. 9a-9l depict a fabrication process for manufacturing optical imager shown in FIG. 6.

FIG. 14b depicts a single pyramid unit cell that was used to perform calculation for FIG. 14a.

Figure 1:
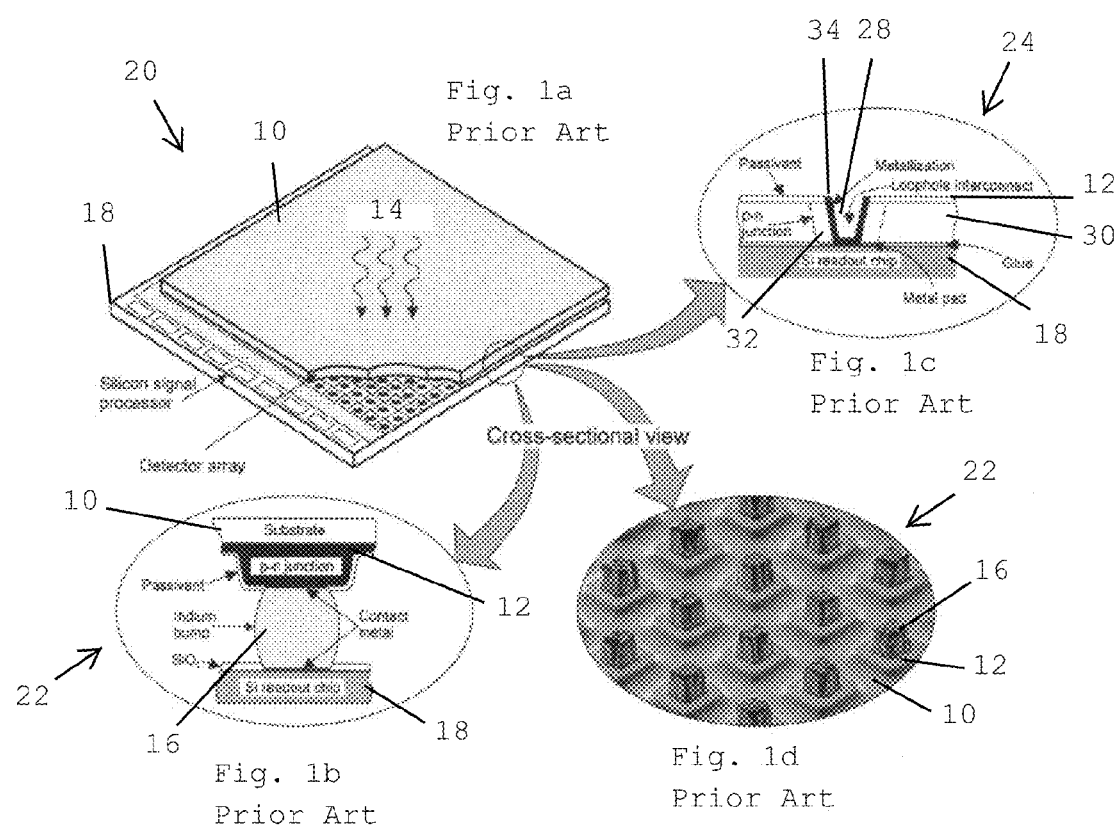
FIGS. 1a-1d depict Prior-Art optical imagers.
Figure 2:
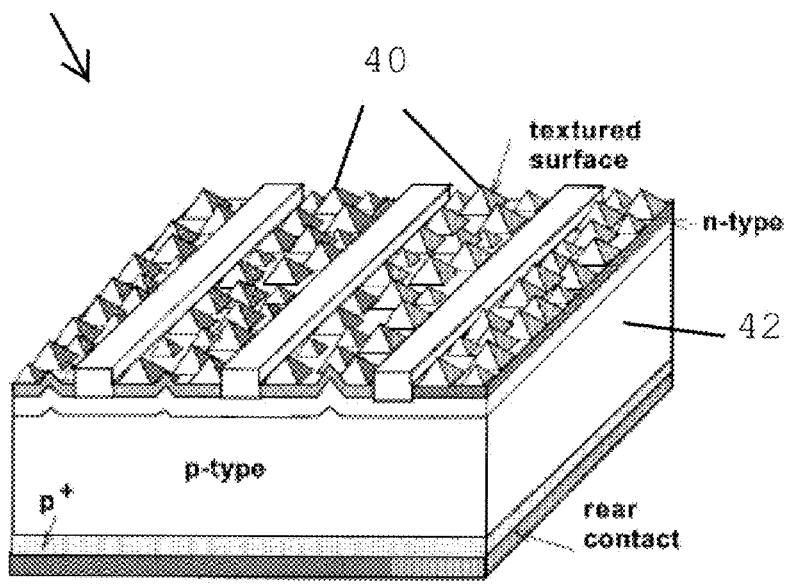
FIG. 2 depicts Prior-Art solar cell with pyramidally textured surface.
Figure 3:
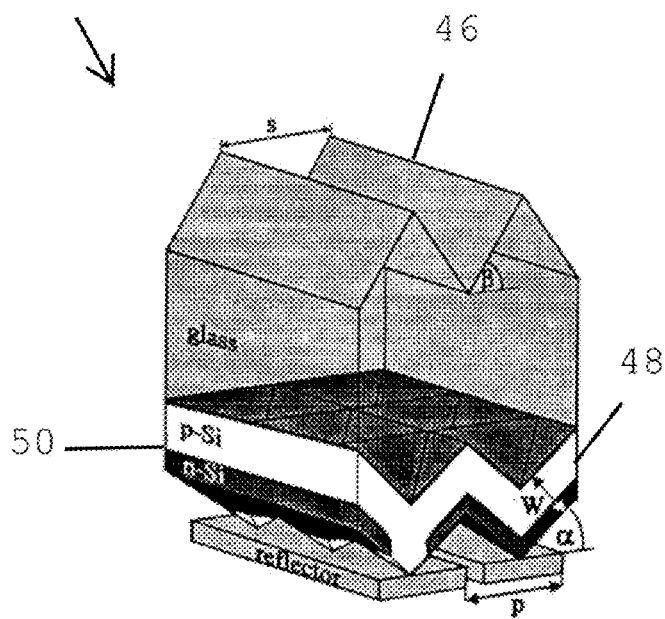
FIG. 3 depicts Prior-Art solar cell with sloped sidewalls.
Figure 4:
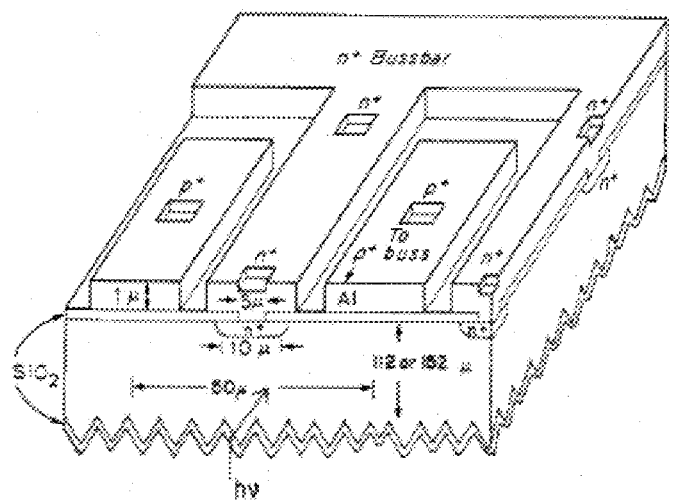
FIG. 4 depicts Prior-Art solar cell with back side contacts.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

The present disclosure relates to photon detectors that may be used in a focal-plane-array optical imager. The constraints for photon detectors are quite different from the constraints associated with most solar cells described above. The photon detector performance is given in terms of its signal to noise ratio. Although the detected signal is to be maximized, the noise (from thermal generation of electrical carriers rather than from carrier generation accompanying the photon absorption) must be kept low. In contrast, a solar cell is concerned with carrier generation but not with noise. Furthermore, the photon detector usually has an absorber material with a direct energy-band gap. Thus, the absorption efficiency is high. Usually the thickness of the absorber is no more than 2 times the longest wavelength of the light to be absorbed, especially when there is a back-side reflector for two-pass absorption. In contrast, most solar cells have an absorber material such as silicon with poor absorption efficiency. Thus, the thickness of a solar cell typically is many times larger (e.g., 10× to 50×) than the wavelength of the light to be absorbed.

The novel infrared detector (imager) presently disclosed contains novel quantum detectors having very broad bandwidth, for example, such as having sensitive detection ranging from visible to midwave infrared (MWIR) wavelengths (e.g., 0.4-4.0 µm). The imager may contain an array of multiple detectors, arranged as a collection of pixels, that are electrically coupled to a read-out integrated circuit. Also, the pixel array may lie on a focal plane of imaging optical elements, such as lenses. Each detector pixel comprises a pyramidal structure containing material that absorbs light of the desired broad wavelength range. The pyramidal structure may comprise a set of closely spaced pyramid shapes, with a pointed end of the pyramids facing the incident light. The pyramid shaped features have reduced reflection of the incident light over the broad bandwidth. The pyramid shaped absorbers also trap the light, for increased absorption efficiency. Although a 2-dimensional arrangement of pyramids having square or rectangular bases are preferred, arrangements of other pyramidal shapes such as ones having triangular, circular or hexagonal bases also may be used. Each detector preferably comprises a p-type region and an n-type region, with either one or both of these doped regions being capable of absorbing the incident light. Each detector pixel also includes at least one electrical contact, preferably ohmic, that is electrically connected to the p-type or the n-type region. This electrical contact permits photo-generated electrical carriers to be extracted from each pixel of the imager.

In one embodiment according to the present disclosure, the bases of the pyramids may have a metal backside electrical contact. The metal backside contact may then be bonded to an electrical contact pad of the read-out integrated circuit. In another embodiment according to the present disclosure, the metal surface of the backside contact may also serve to reflect light back into the absorbing material of the pyramids, further enhancing the absorption. In another embodiment, the bases of the pyramids merge together into an additional region of electrical-carrier transporting material. In this embodiment a second electrical contact may be made to this electrical-carrier transporting material, to form the "common" contact for the imager. In one embodiment according to the present disclosure, the pointed ends of the pyramids are electrically connected to and contact a grid of electrically conducting material. This grid allows light to penetrate through the spaces between the conductors, so that the light can be absorbed by the pyramid regions underneath. In another embodiment, there may be two sets of pyramids. A first set may have a pointed end facing the incident light and a second set may have a pointed end directed away from the incident light. The bases of the first set and the bases of the second set abut each other. The sidewalls of the second set of pyramids may be coated with metal to further reflect the light back into the pyramidal absorbers.

The purpose of the imager presently disclosed is to achieve high-sensitivity detection of the incident light over a much broader band of optical wavelengths than is obtained with previously known optical imagers. The disclosed optical detectors are designed to have high sensitivity over many octaves of optical bandwidth, with that detection bandwidth possibly being greater than one decade. The high sensitivity may be achieved by reducing the reflection of the incident light by the detector for all of those wavelengths of the incident light. Also, the high sensitivity may be achieved by efficiently capturing and absorbing the incident light (photons) to produce electrical carriers (electrons and holes), with the amount of output electrical current extracted from the detector being related to the amount of light incident upon the detector pixel. And, the high sensitivity may be achieved by minimizing the dark current, by reducing the volume of light-absorbing material, which introduces noise from its thermal (dark) generation of electrical carriers.

Figure 5A:
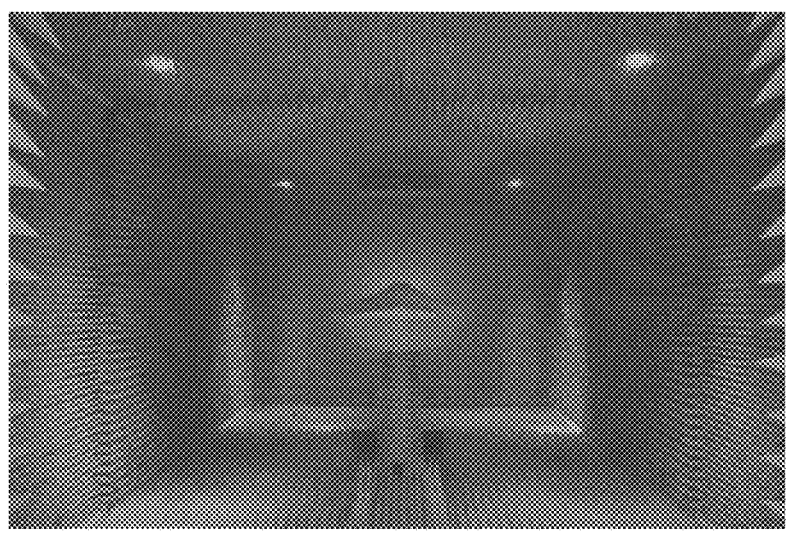
FIG. 5a depicts microwave anechoic chamber as know in the art.
Figure 5B:
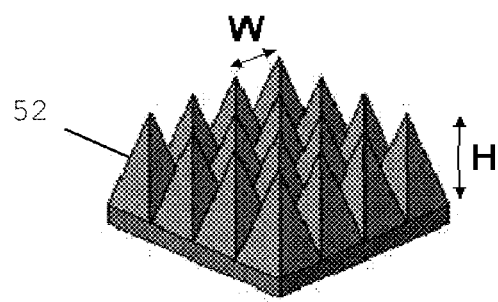

The presently disclosed optical detectors and optical imagers may comprise pyramid-shaped optical absorbers. Pyramid-shaped structures comprising material that absorb electromagnetic radiation are commonly used in anechoic chambers for radio-frequency, microwave and millimeter wave radiation. An example of such an anechoic chamber is shown in FIG. 5a. The walls of the anechoic chamber are covered with pyramidal absorbers 52 as shown in FIG. 5b. The pyramidal absorbers 52 prevent any of the incident radiation from being reflected by the walls back into the chamber. The pyramidal absorbers 52 can function effectively over a very broad range of wavelengths or frequencies of the incident radiation. In general, the width W of the base of the pyramids 52 should be greater than the wavelength of the lowest frequency of interest (longest wavelength of interest). Also, the height H of the pyramids 52 should be at least one half of the wavelength of the lowest frequency of interest. The width of the tip of the pyramids should be smaller than the wavelength of the highest frequency of interest, preferably smaller than one-half of the shortest wavelength of interest. Pyramidal absorbers 52 are effective for all polarizations of the incident radiation.

Pyramidal absorbers have not been used for optical chambers that require negligible reflection from the walls of the chamber. For optical radiation, other means such a black absorbers comprising roughened surfaces of light absorbing material such as carbon, or even gold, are used effectively to prevent reflection. The carbon black films contain many fibers or spikes of the carbon. The gold black films typically contain many small spikes or balls of the gold. Unlike the absorbers of the anechoic chambers, the detectors presently disclosed also must efficiently generate electrical signal from the absorbed light. Thus, the absorbing material in a given detector pixel must be electrically contiguous, so that electrical current can be extracted with minimal loss. Also, to increase the detection sensitivity, it is desirable to reduce the overall volume of the absorber material without compromising the detection efficiency. According to the present disclosure, reduction of the absorber's volume may be achieved by using a light absorbing structure that comprises many pyramid-shaped absorbers that are electrically contiguous. A structure comprising a collection of pyramids whose tips all point in the same direction and whose bases touch each other has one-third the volume compared to a film having the same height as those pyramids.

Figure 6:
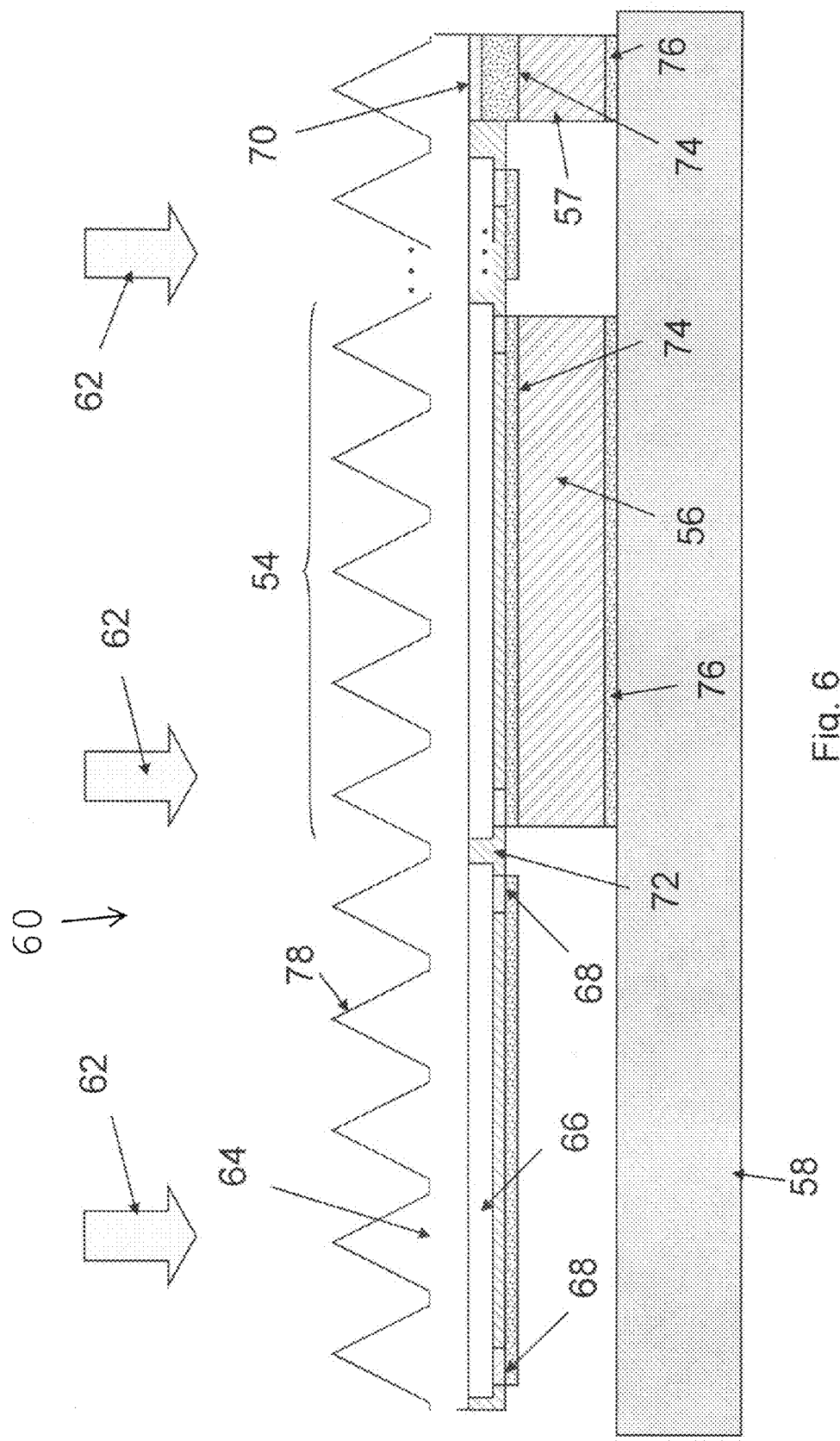
FIG. 6 depicts an exemplary embodiment of an optical imager according to the present disclosure.

FIG. 6 depicts one exemplary embodiment of a novel detector array 60 according to the present disclosure. The detector array 60 may comprise many detector pixels 54 that are bump bonded to a read-out integrated circuit (ROIC) 58. One or more detector pixel 54 may be electrically connected to the ROIC 58 by means of a solder bump 56. (For the sake of simplicity and enhanced clarity, only some of the solder bumps 56 are shown in the FIG. 6). Besides the solder bumps 56 connecting to the individual detector pixels 54, additional solder bumps 57 may provide electrical connection for the common contact of the imager. In one exemplary embodiment, electrical connections are made to the back side of the detector, which is the side facing away from the incident light 62.

As shown in FIG. 6, the detector array 60 comprises an absorber 64 that couples the incident light 62 into the volume of the absorber 64 and that generates electrons and holes from the absorbed photons of light. The absorber 64 may be either n-type semiconductor material or p-type semiconductor material whose energy band gap is sufficiently small to absorb the incident light 62 and generate the electron/hole pairs as a result of an interband process. Each detector of the array also contains at least one extractor 66. The extractor 66 may serve to extract the photo-generated minority carrier and couple that carrier to an ohmic contact 68. Another contact 70 may be coupled to the absorber 64. In one exemplary embodiment, if the absorber 64 is n-type, the photo-generated electrons are the majority carriers in the absorber 64 and are extracted through the contact 70 coupled to the absorber 64. The photo-generated holes are the minority carriers in the absorber 64 and are coupled into the extractor 66 and then extracted through the contacts 68 coupled to the extractor 66. The extractor 66 may be either p-type or n-type. When both the absorber 64 and the extractor 66 are composed of the same semiconductor material, the extractor 66 may be p-type if the absorber 64 is n-type.

The detector array 60 may also contain dielectric passivation material 72 that surrounds the edges of the PN junction and that also covers much of the back side of the extractor 66. The back side of the extractor 66 may further be covered by a metal layer 74 that acts as an optical reflector for the incident light 62. This metal layer 74 may further serve as an electrical bonding pad for the detector pixel 54. Each detector pixel 54 may be connected to the read-out integrated circuit 58 of the imager 60 by means of this metal bonding pad 74, a solder bump 56 and another bonding pad 76. The bonding pads 74 and 76 may comprise several layers of metal (not shown). In one exemplary embodiment, bonding pads 74 and 76 comprise an electrically conductive layer composed of gold, a diffusion barrier to the solder composed of nickel, and a thin layer of non-oxidizing material also composed of gold.

Figure 7:
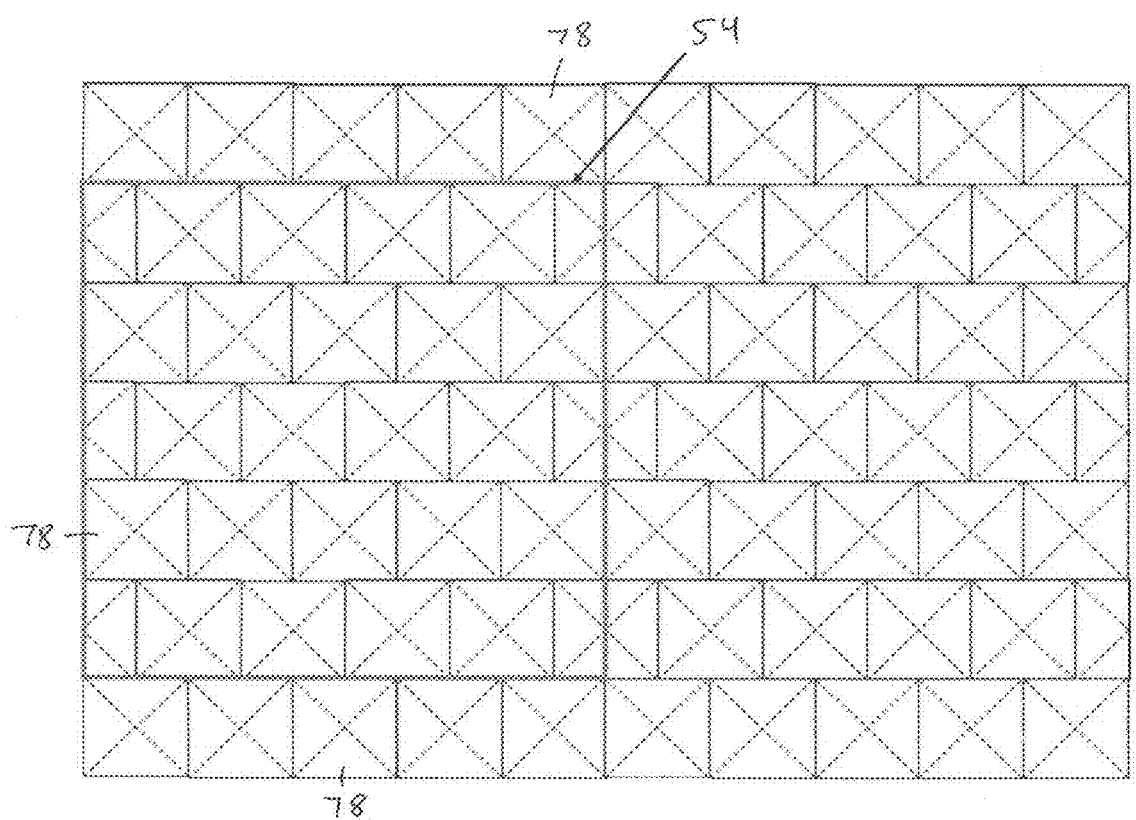
FIG. 7 depicts a top view of a pyramid pattern formed in an absorber shown in FIG. 6.
Figure 8:
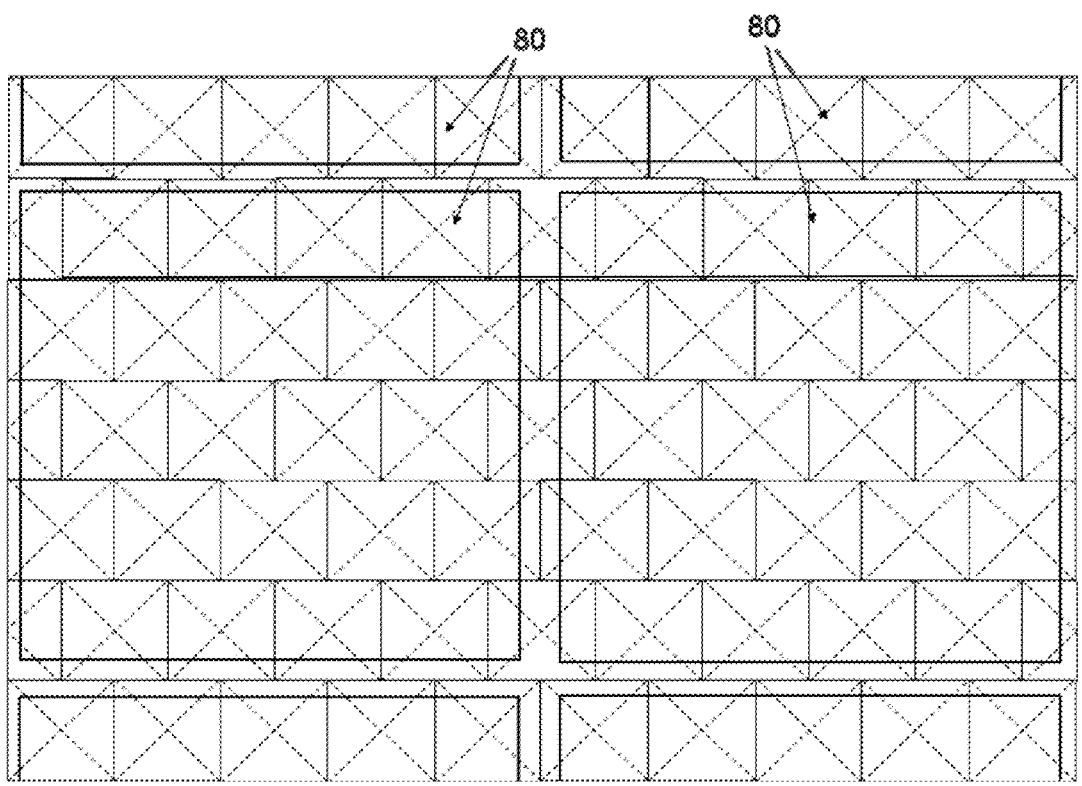
FIG. 8 depicts a bottom view of a pyramid pattern formed in an absorber shown in FIG. 6.

In one exemplary embodiment, the surface of the absorber 64 is shaped to have a set of pyramids 78, as illustrated in FIGS. 6 and 7. In an exemplary embodiment, there are multiple number of pyramids 78 within the area defined for each detector pixel 54 of the imager 60. The area of a detector pixel 54 is defined optically and electrically by the photo-generated minority carriers (e.g., holes) that diffuse through the absorber 64 and to the extractor 66 of that pixel. However, as viewed from the top side in FIG. 7, the pyramids 78 for one detector pixel 54 and the pyramids 78 for adjacent detector pixels 54 may abut together in a continuous manner such that there is no definite physical delineation between adjacent pixels. FIG. 7 illustrates pyramids 78 that have square shaped bases. These pyramids are placed in an offset configuration, with the apex of the pyramids 78 in one row being offset from the apex of the pyramids 78 in an adjacent row. Such a configuration may enhance the capture of incident light 62 into the absorber 64. However, other configurations, including ones with non-offset alignments, also may be used. Furthermore, other shapes of pyramids 78, such as ones having rectangular bases, triangular bases, circular bases and hexagonal bases, also may be used. The set of pyramids act to reduce the reflection of the incident light 62, as discussed above regarding the pyramidal absorbers 64. From the back side, the detector array looks like an array of bond pads 80, with a bond pad for each pixel, as shown in FIG. 8. The bond pads 80 may be separated by regions of dielectric 72. These dielectric regions 72 may also define the extent of the flow of the solder bumps, so that adjacent pixels are not electrically short-circuited together.

As mentioned above, the detector array 60 may also contain at least one contact 70 that is connected to the absorber 64. The contact 70 serves to extract the photo-generated majority carriers. The contact 70 may also serve as a common contact for the entire array of detector pixels (or for a subset of those detector pixels). Additional solder bumps and metal bond pads connect this contact 70 to the read-out integrated circuit 58.

FIGS. 9a-9l depict an exemplary fabrication process for fabricating the detector array and attaching that detector array to the read-out integrated circuit as described above. The following fabrication process is suitable for all of the embodiments disclosed herein of the detector array.

Figure 9A:
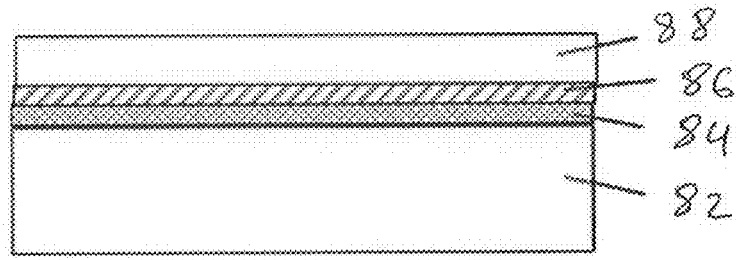

Referring to FIG. 9a, using epitaxial growth technique such as molecular beam epitaxy or metal-organic chemical vapor deposition, an optional stop etch layer 84, an extractor layer 86 and then the absorber layer 88 are formed on a substrate wafer 82. In one exemplary embodiment, for detection of optical wavelengths of 4-5 μm and shorter, the substrate wafer 82 may be composed of GaSb material, the optional stop etch layer 84 may be composed of AlGaSb material, the p-doped extractor layer 86 may be composed of InAsSb material, and an n-doped absorber layer 88 may be composed of InAsSb material. In another exemplary embodiment, the substrate wafer 82 may be composed of GaSb material, the optional stop etch layer 84 may be composed of AlGaSb material, the n-doped extractor layer 86 may be composed of InAsSb material, and the p-doped absorber layer 88 may be composed of InAsSb material. Lattice matched $InAs_{0.9}Sb_{0.1}$, for example, provides absorption of wavelengths of 4.7 μm and shorter when operated at 300K temperature and absorption of wavelengths of 4.3 μm and shorter when operated at 200K temperature.

For detection of wavelengths as long as 5.0 μm at 200K temperature, material such as $InAs_{0.8}Sb_{0.2}$, having substantial lattice mismatch (approximately +0.7%), could be used. Another alternative to InAsSb is to use a Type II superlattice consisting of InAs/GaSb material for the absorber 88. Another example of a suitable substrate 82, for detection of >5.0 μm wavelength light, is InSb material. The optional stop etch layer 84 could be a thin layer of InAlSb material. The extractor 86 and absorber 88 could be composed of doped InSb or InAlSb material.

Other examples of extractor 86 materials include extractors 86 composed of multiple layers of semiconductor material. In one exemplary embodiment, the extractor 86 for an n-type InAsSb absorber 88 could be composed of layers of n-type GaAlAsSb and p-type GaSb materials. Such a structure facilitates the flow of the photo-generated electrons away from the extractors 86 and to the ohmic contact of the absorber 88. Such a structure also is effective in reducing the dark current that arises from the depletion layer between the absorber 88 and extractor 86, as discussed in an article by P. Klipstein ("XBn barrier photodetector for high sensitivity and high operating temperature infrared sensors," Proceedings of SPIE, vol. 6940, paper 69402U-1), which is incorporated herein by reference. In another exemplary embodiment, the extractor 86 for n-type InAsSb absorber 88 could be composed of layers of n-type GaAlAsSb, p-type GaSb and then n-type InAs materials. The use of the additional n-type InAs layer, which forms a Type II energy-gap alignment with the GaSb, permits the ohmic contact for both the extractor 86 and the absorber 88 to be made to n-type, narrow bandgap materials.

Figure 9B:
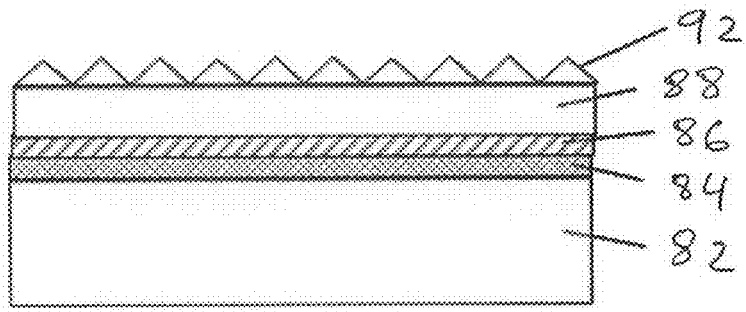
Figure 9C:
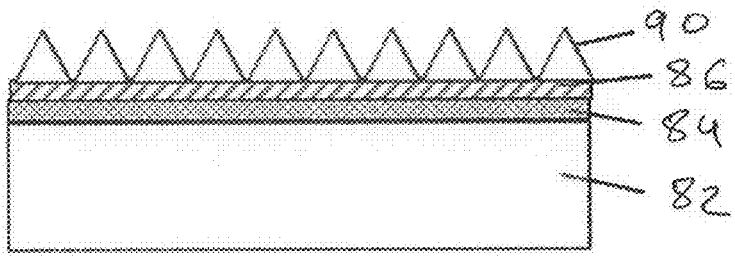

Referring to FIGS. 9b and 9c, pyramidal shapes 90 are formed in the absorber layer 88. An etching process may be used to form pyramidal shapes 90. In one exemplary embodiment, the pyramid shapes 90 are etched by depositing and forming an etch mask 92 that has a pyramid shape. The pyramid outline of the masking material 92 may then be transferred into the absorber 88 by dry etching techniques such as, for example, reactive ion etching or ion beam milling. The height of the masking layer 92 may depend on the dry-etch selectivity between the masking material 92 and the material of the absorber 88. Suitable etch masks 92 may include photoresist, polymers such as benzo-cyclo-butene, and silicon dioxide. A pyramid shape may be formed in photoresist by gray scale lithography. A pyramid shape may be formed in non-photo-definable polymers by means of imprint lithography using a mold that has an inverted pyramid shape. A pyramid shape may be formed in silicon dioxide by using an additional thin mask layer having a square shape and then etching the silicon dioxide with an isotropic wet etchant.

Figure 9D:
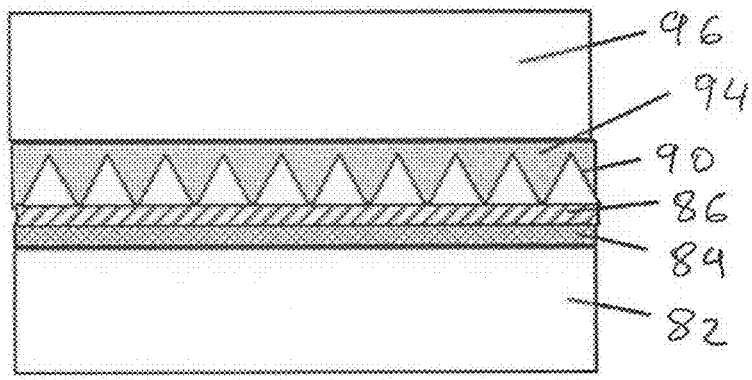

Referring to FIG. 9d, a material 94 is deposited in the spaces between the pyramids 90. In one exemplary embodiment, the material 94 may be composed of spin on glasses and various polymers. The material 94 may then be planarized. An optional adhesion layer (not shown) can be deposited on top of the planarized material 94. Then, a carrier substrate 96 is attached or bonded to the surface of the planarized material 94 or the adhesion layer (not shown). This process is used for wafer transfer.

Figure 9E:
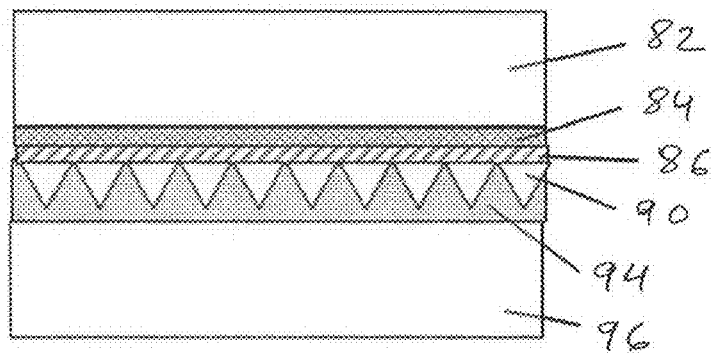
Figure 9F:
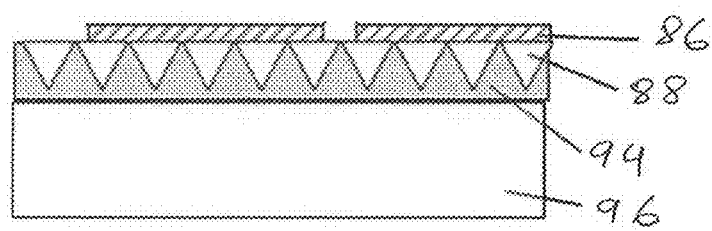

Referring to FIG. 9e, the structure shown in FIG. 9d is turned upside-down. Referring to FIG. 9f, the substrate 82 is removed or etched away as know in the art. The stop etch layer 84 facilitates this substrate 82's removal. The stop etch layer 84 is then also removed by known etching techniques, leaving the extractor layer 86 exposed. The extractor 86 may then be patterned by known photolithography and wet or dry etching methods. In fact, the exposed back side of the absorber layer 88 also can be etched. One exemplary embodiment that makes use of etching the absorber 88 from its back side is discussed below. The back surface of the hack-side etched extractor 86 and absorber 88 could have various shapes, including pyramid shapes, as discussed in detail below.

Figure 9G:
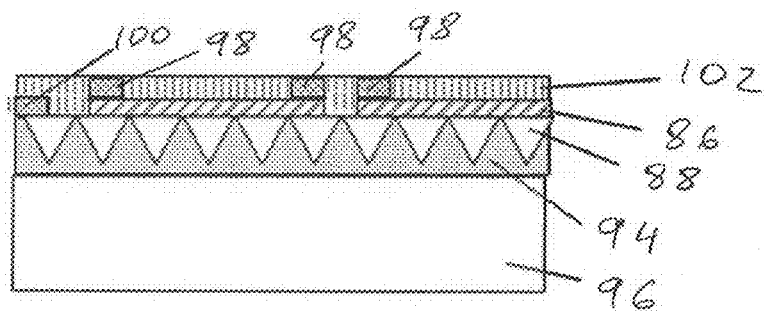

Referring to FIG. 9g, regions of ohmic-contact metals 98 and 100 are then deposited and patterned using exemplary techniques such as evaporation and lift-off or sputtering and etching. Both the ohmic-contact metals 98 for the extractor 86 and the ohmic-contact metal 100 for the absorber 88 may be deposited and patterned at the same time. Following the formation of the ohmic-contact metals 98 and 100, or in some cases before their formation, a film of dielectric passivation material 102 composed of, for example, silicon dioxide, polyimide or benzo-cyclo-butene material is deposited on top of the structure. This passivation material 102 may serve to reduce the amount of surface recombination that occurs in the semiconductor material, and especially at the outer edges of PN junctions.

Figure 9H:
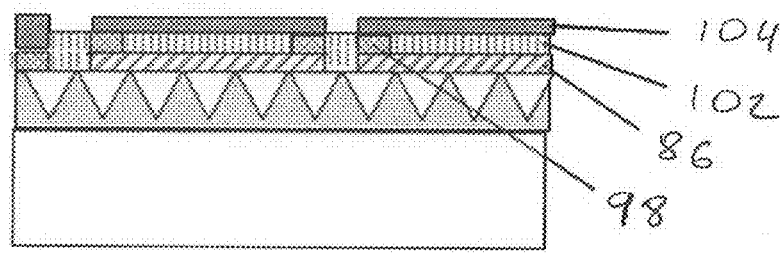

Referring to FIG. 9h, vias may be patterned and etched through the dielectric passivation material 102 to expose certain regions of or for the ohmic-contact metals 98 and 100. Metal bonding pads 104 may then be deposited and patterned. These metal bonding pads 104 can then be used for solder bump 106 bonding of the detector array to the read-out integrated circuit 110, as illustrated in FIGS. 9i-9l.

Referring to FIGS. 9i-9j, once the detector array, held on the carrier substrate 96, is bonded to the read-out integrated circuit 110, the carrier substrate 96 can then be removed. In one exemplary embodiment, a protective layer of material (not shown) such as photoresist may be used to cover and protect the read-out integrated circuit 110, the solder bumps 106 and the bond pads 104 and 108 from the etchant used to remove the carrier substrate 96. Referring to FIG. 9k, after the carrier substrate 96 is removed, the adhesion material (not shown) over the pyramids 90 may also be removed, and the planarization/fill material 94 may be optionally removed as well. Referring to FIG. 9l, in one exemplary embodiment, ohmic contacts 112 may be formed on the tips of the pyramids 90 and additional metal interconnects can be deposited on patterned onto the now exposed top side of the detector array. These top-side metal interconnects are further discussed below.

Figure 10:
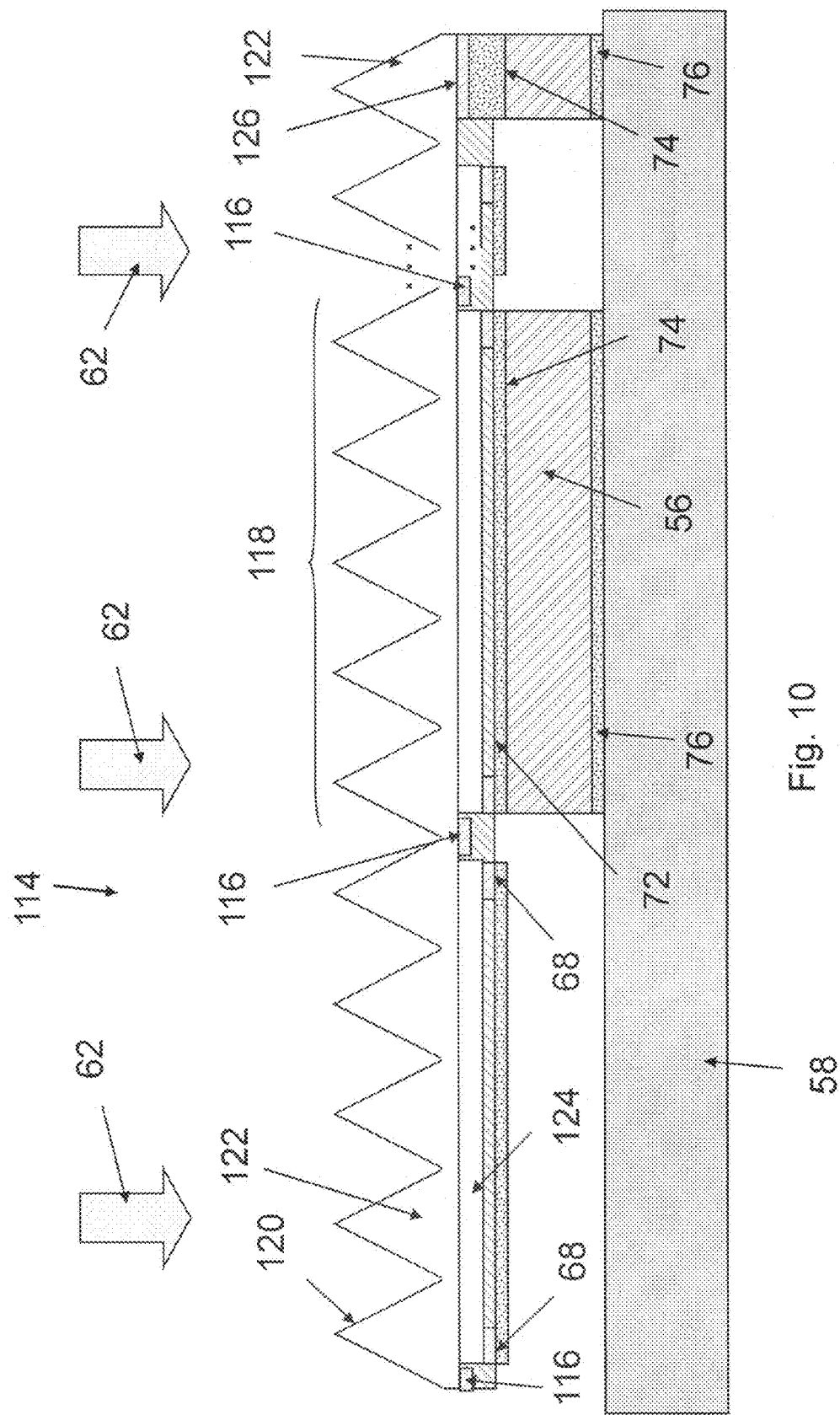
FIG. 10 depicts another exemplary embodiment of an optical imager according to the present disclosure.

FIG. 10 depicts another exemplary embodiment of a novel detector array 114 according to the present disclosure. This detector array has ohmic contacts 116 formed near each detector pixel 118 rather than only having a single ohmic contact 70 shared between multiple detector pixels 54 of the detector array 60 as shown in FIG. 6. By forming the ohmic contacts 116 at the periphery of each detector pixel 118, the pyramids 120 can be etched deeper into the absorber layer 122, thereby further reducing the total volume of absorber material. However, there needs to be some laterally contiguous thickness of absorber material between the bottom of the etched pyramids 120 and the top of the depletion region formed between absorber 122 and extractor 124, in order to permit the photo-generated majority carriers to flow to the ohmic contacts 116 without incurring unacceptable ohmic (resistive) voltage drops.

Figure 11:
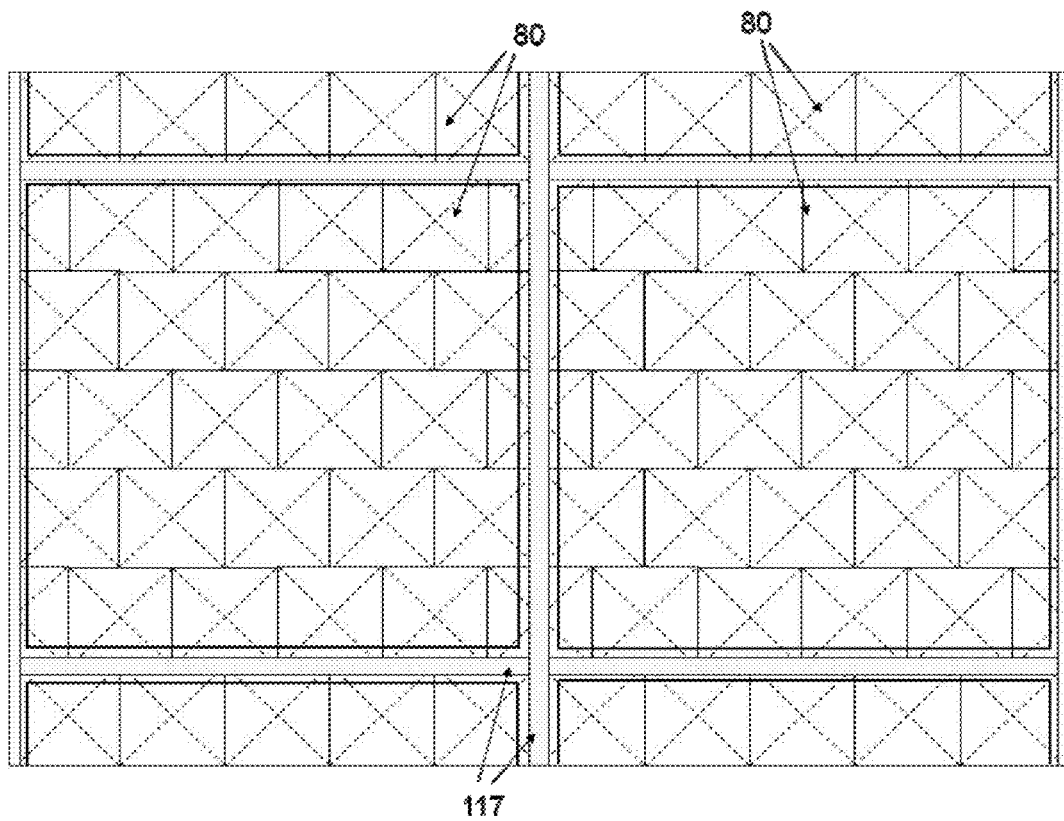
FIG. 11 depicts a bottom view of a detector array shown in FIG. 10.

The pattern of ohmic contact metal 116, and the optional metal interconnect lines 117 that contact to and interconnect the ohmic contacts 116, forms a low-resistance path for the photo-generated electrical current to flow from each pixel 118 to the "common" bond pads 126 that are located at the periphery of the detector array 114. An example of a configuration of the metal interconnect lines 117 is shown in FIG. 11. By using the low-resistance metal paths to carry the current instead of requiring the photo-generated majority carriers to flow through the absorber 122, the thickness of absorber material between the base of the pyramids 120 and the depletion layer can be reduced to further reduce the dark-current generation volume of the detector array, thereby improving its detectivity.

The embodiments illustrated in FIGS. 6 and 10 require the incident light 62 to pass through the absorbers 64 and 122, respectively, and the extractors 66 and 124 before the not yet absorbed photons of that incident light 62 are reflected from the metal reflector surface 74 at the back side of the detector pixel. For some material structures, photons absorbed in the extractors 66 and 124 do not contribute to the desired output current of the detectors 60 and 114. Thus, it is preferable to reduce the volume of the extractors 66 and 124 and to have more of the back side of the absorbers 64 and 122 in proximity to the metal reflector 74.

Figure 12A:
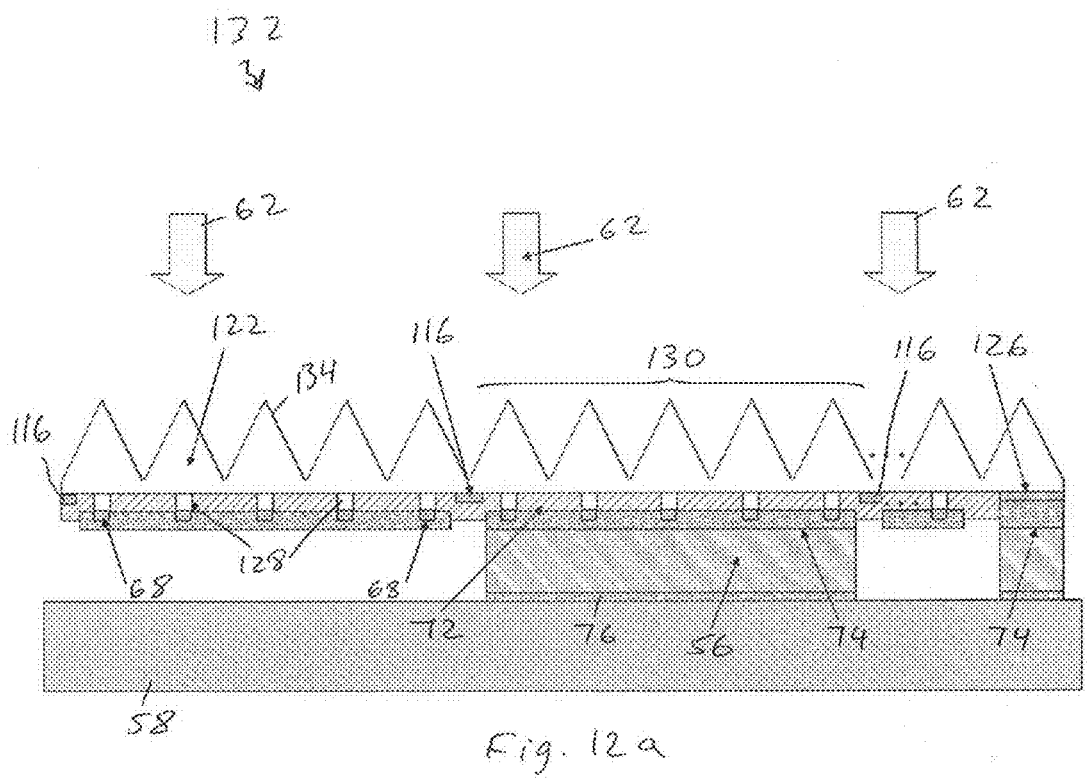
FIGS. 12a-12b depict another exemplary embodiment of an optical imager according to the present disclosure.
Figure 12B:
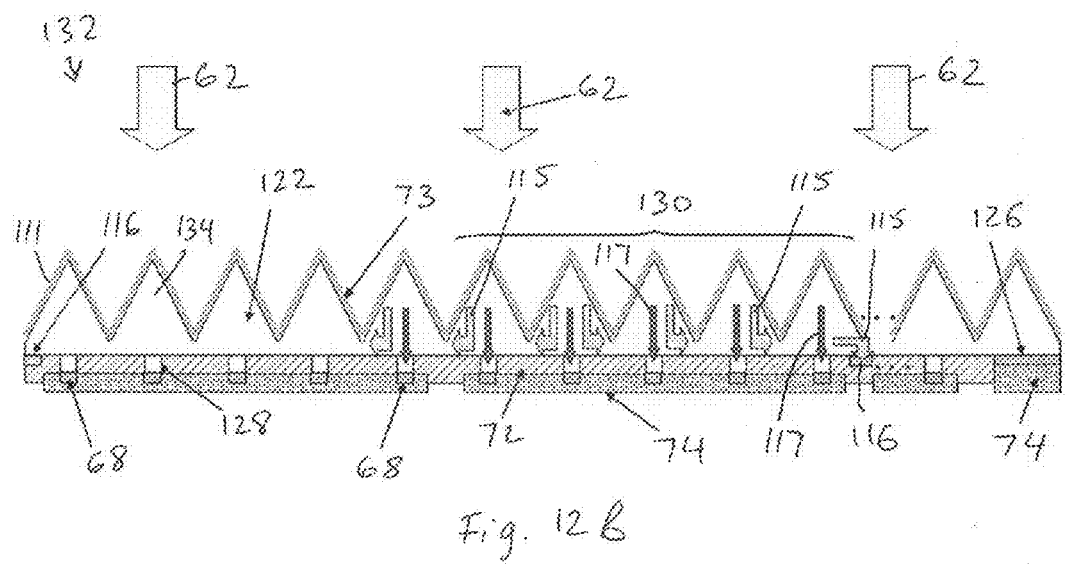

FIGS. 12a-12b depict another exemplary embodiment of a novel detector array 132 according to the present disclosure in which multiple, small regions of extractor 128 are formed in each detector pixel 130. As shown in the FIGS. 12a-12b, the regions of extractor 128 are located underneath each pyramid 134. However, other arrangements of the extractor regions also could be used. The detector array 132 comprises an absorber 122 that couples the incident light 62 into the volume of the absorber 122 and that generates electrons and holes from the absorbed photons of light. The absorber 122 may be either n-type semiconductor material or p-type semiconductor material whose energy band gap is sufficiently small to absorb the incident light 62 and generate the electron/hole pairs as a result of an interband process. Each detector of the array also contains small regions of extractor 128. The extractors 128 may serve to extract the photo-generated minority carriers and couple those carriers to an ohmic contact 68. Other contacts 116 and 126 may be coupled to the absorber 122. In one exemplary embodiment, if the absorber 122 is n-type, the photo-generated electrons are the majority carriers in the absorber 122 and are extracted through the contacts 116 as shown by arrows 115 in FIG. 12b. The photo-generated holes are the minority carriers in the absorber 122 and are coupled into the extractors 128 and then extracted through the contacts 68 as shown by arrows 117 in FIG. 12b. The extractors 128 may be either p-type or n-type. When both the absorber 122 and the extractors 128 are composed of the same semiconductor material, the extractors 128 may be p-type if the absorber 122 is n-type. As shown in FIG. 12b, the slopes of the pyramids 134 may also be covered by a surface-passivation layer 73 to prevent dark current due to surface states and carrier recombination at those surface states. The surface passivaiton layer 73 may also be used with other embodiments described in the present disclosure.

Figure 13:
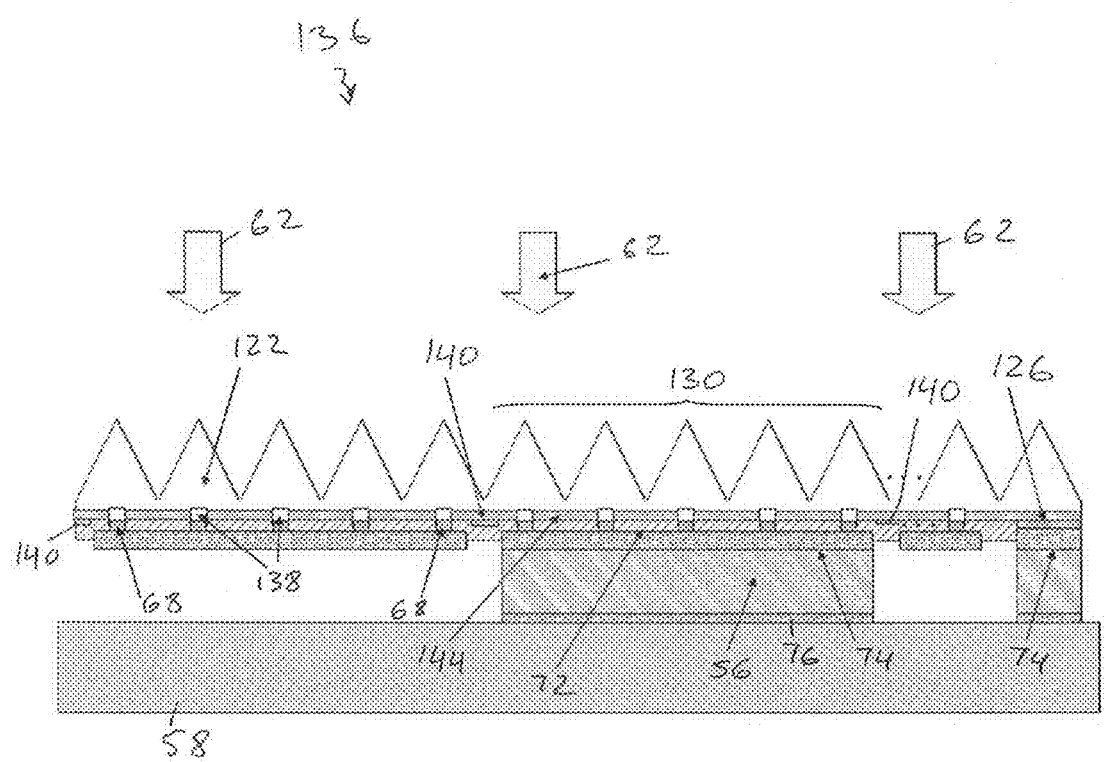
FIG. 13 depicts another exemplary embodiment of an optical imager according to the present disclosure.

FIG. 13 depicts another exemplary embodiment of a novel detector array 136 according to the present disclosure that contains multiple extractor regions 138 in each detector pixel 130. In this exemplary embodiment, the extractor regions 138 may be formed by diffusion or implantation of a dopant. The detector array 136 may also contain an optional barrier layer 144 that is located beneath the absorber 122 and above the ROIC 58. The barrier layer 144 may be of the same doping type as the absorber 122 whereas the extractor regions 138 have the opposite doping type. The barrier layer 144 may be composed of a material that has a wider bandgap than the material of the absorber 122. The energy bands of the barrier layer 144 and absorber 122 materials may form a Type I alignment or a Type II alignment. With a Type I alignment, both the conduction band edge and the valence band edge of the barrier layer 144 are larger than the conduction and valence band edges of the absorber 122. For a Type II alignment, the band edge of one band in the barrier layer 144 is larger than the band edge of that same band in the absorber 122. However, the band edge of the other band in the barrier layer 144 is lower than or at the same level as the band edge of that same band in the absorber 122. Thus, one carrier type can flow from the absorber 122 into the barrier layer 144 but the other carrier type tends to remain in the absorber 122. If flow of the majority carrier type is blocked by the barrier layer 144, the PN junction is preferably located within the barrier layer 144. However, if the minority carrier type is blocked by the barrier layer 144, the PN junction is preferably located within the absorber 122.

Figure 14A:
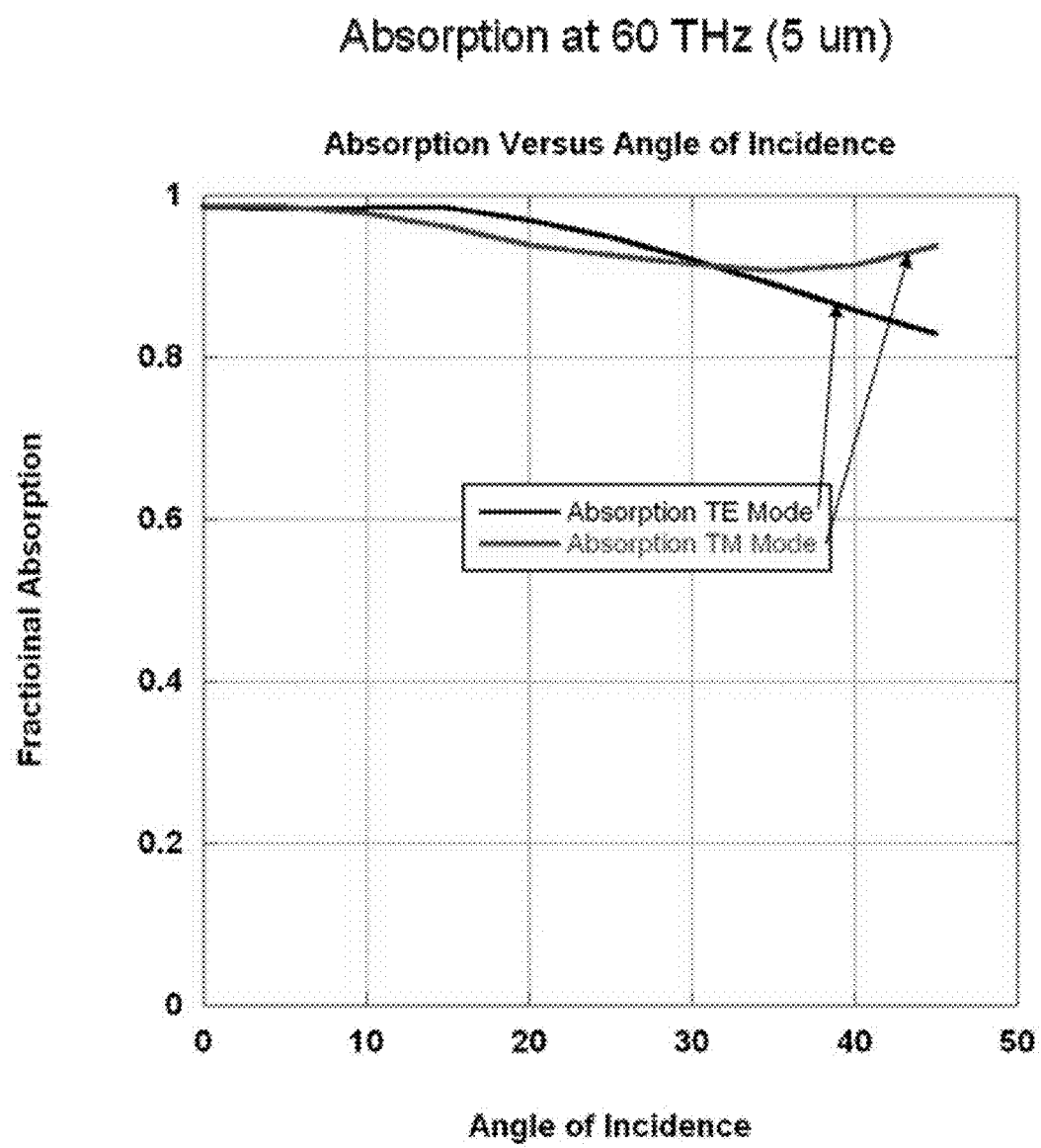
FIG. 14a depicts calculated absorbance of pyramid array for various angles of incidence of the light and for polarization of the light parallel to (TE mode) or perpendicular to (TM mode) the plane of incidence.
Figure 14B:
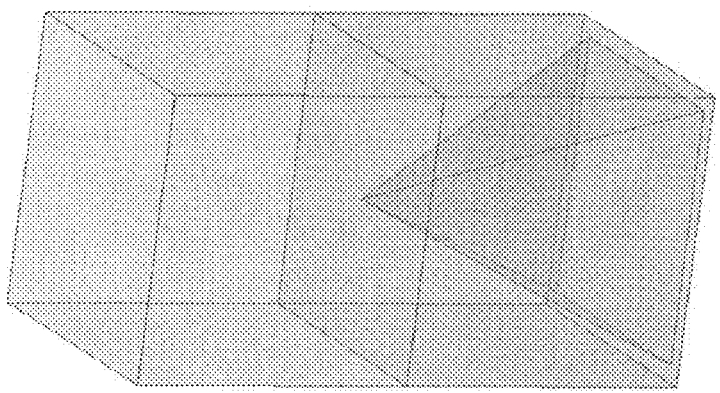

An absorber comprising a collection of pyramids is effective in absorbing the incident light. An absorber may absorb light that is incident over a large range of angles. FIGS. 14a-14b depict the results of calculations made using a high-frequency electromagnetic structures simulator (HFSS by Ansoft) of a periodic array of pyramidal absorbers. The simulation results indicate that the absorption is strong for both polarizations of the incident light. Also, the simulation results indicate that the absorption is strong even when the angle of incidence is greater than 30 degrees, which corresponds to an imager that has f/1 optics. The results shown in the FIG. 14a were made for 5 μm wavelength light and assumed the array of pyramids has pitch of 5 μm and each pyramid has a height of 5 μm and base of 4.4 μm as shown in FIG. 14b. In general, the height of the pyramids may be at least as large as the longest wavelength of the incident light to be detected. The pyramids of the arrays need not have their bases touch each other. Instead, there can be small gaps between the edges of adjacent pyramids. The width of these gaps depends on the minimum wavelength of the incident light that should be detected efficiently by the imager, with low reflection. An optical resonant cavity may be constructed for the short-wavelength incident light to reduce the reflection of the short wavelength light from the regions of the gaps. Use of gaps between the pyramids can further reduce the total volume of absorber material that contributes to the dark current.

Figure 15:
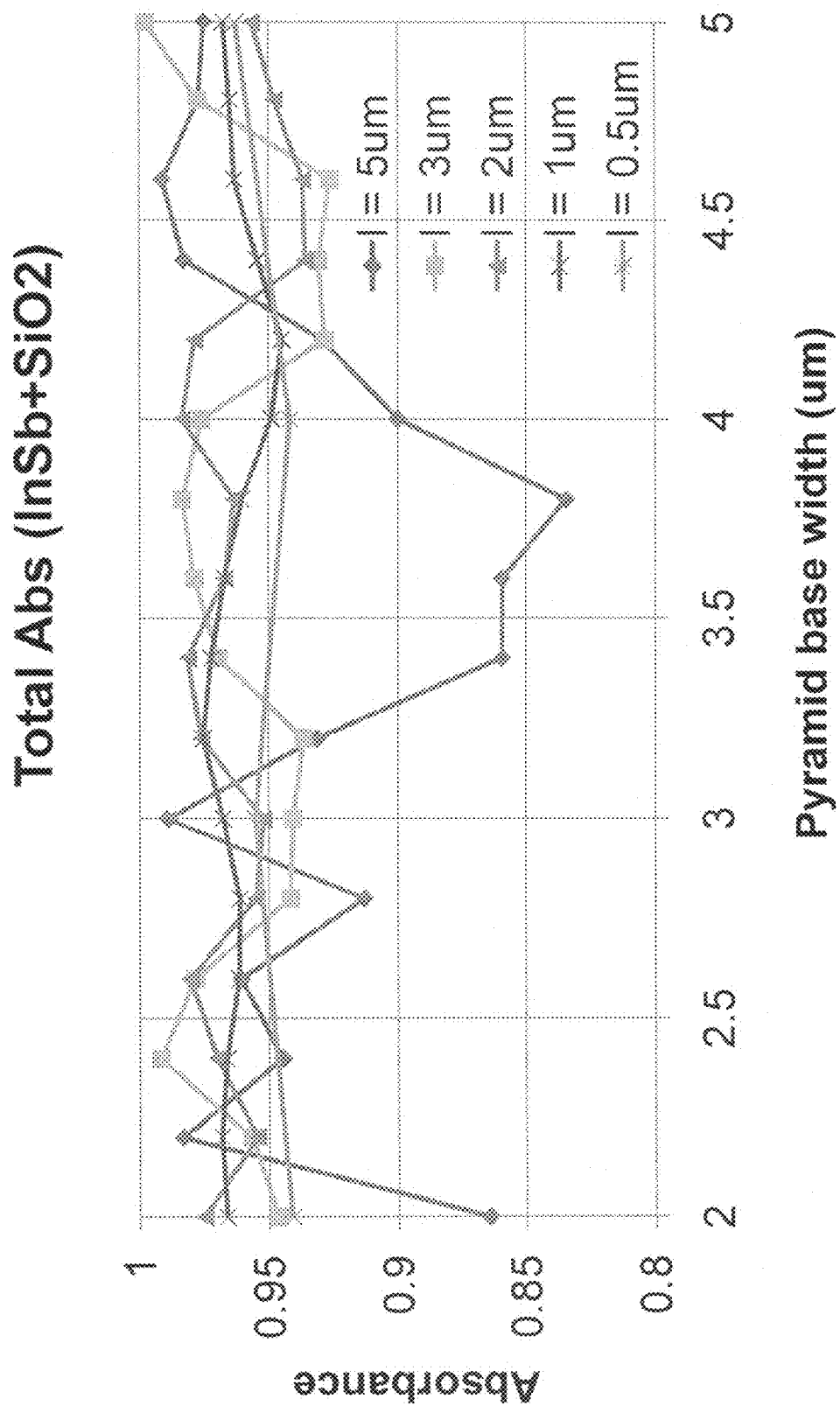
FIG. 15 depicts calculated absorbance of pyramid array for various widths of the pyramid base.

Efficient absorption of the incident light over a broad band of wavelengths is achieved by using the pyramidal absorber. FIG. 15, obtained by HFSS simulations, show that more than 90% of the incident light is absorbed for incident wavelengths between 0.5 and 4.0 μm by a pyramidal absorber whose maximum height is only 5 μm. In an exemplary embodiment, a uniform thickness layer of the same absorber material (InSb was assumed for these calculations), that does not have the etched pyramids, would absorb only 55-70% of the incident light, with the amount of absorption depending on the wavelength of that light and the Fabry Perot cavity effects that occur at those wavelengths. Although the volume of the pyramidal absorber is less than 33% the volume of the uniform-thickness absorber, the efficiency of absorption is much higher. Only when the thickness of the uniform-thickness absorber is more than twice as great as the height of the pyramids (so that the absorber volume is more than 7 times greater) is the light almost fully absorbed in that uniform-thickness absorber. The efficiency of absorption obtained with a pyramidal absorber represents a great improvement in bandwidth compared to prior detectors that make use of "quarter-wave thickness" anti-reflection coatings as discussed above.

With a pyramidal absorber, efficient absorption of the incident light also is achieved for many values of the width of the pyramid base, as shown in FIG. 15. The angle of the pyramid sidewall becomes shallower as the width of the base increases.

Figure 16:
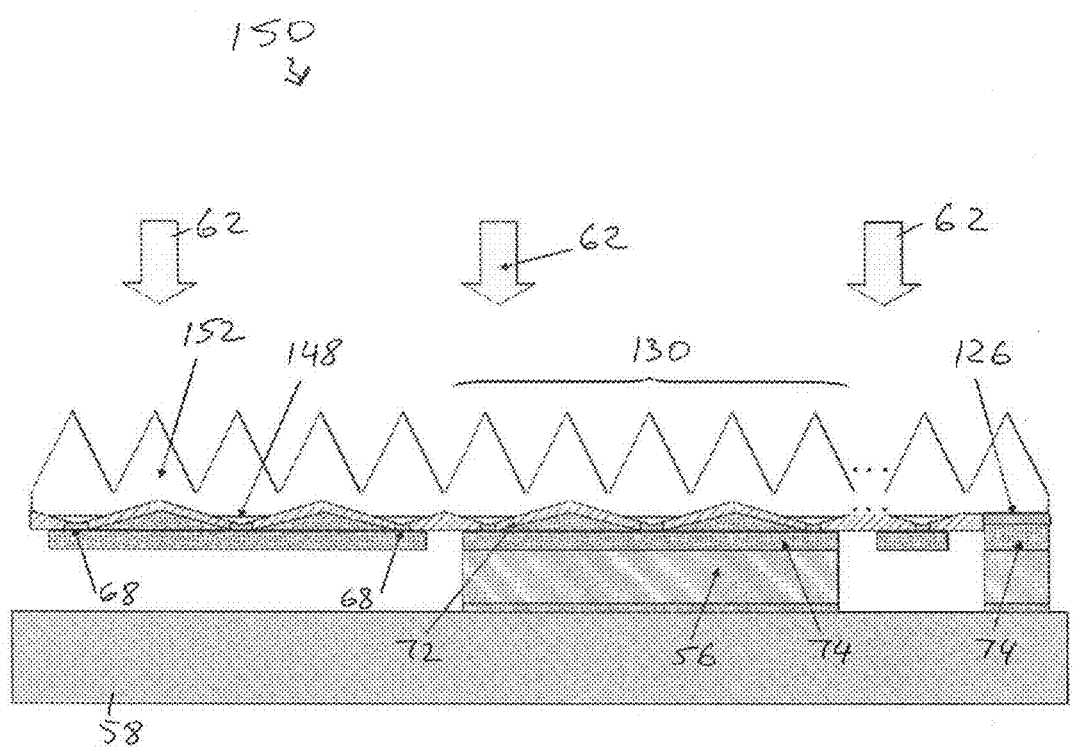
FIG. 16 depicts another exemplary embodiment of an optical imager according to the present disclosure.

FIG. 16 depicts another exemplary embodiment of a novel detector array 150 according to the present disclosure that has an absorber 152 with pyramids etched into both its top side and its bottom side. By forming pyramids on both sides of the absorber 152, the effectiveness of the light or photon trapping can be further improved, albeit with a somewhat more complicated fabrication process. As shown in the FIG. 16, the pyramids on the bottom side need not have the same pitch as the pyramids on the top side of the absorber 152. The extractor regions 148 may be located at the bottom tips of the pyramid shapes formed on the bottom side of the absorber 152. The extractor regions 148 may be formed by epitaxial growth, by diffusion or implantation: The sidewalls of the pyramid shapes at the bottom side may be coated with a passivation material 72 and also with metal reflectors 74.

Figure 17:
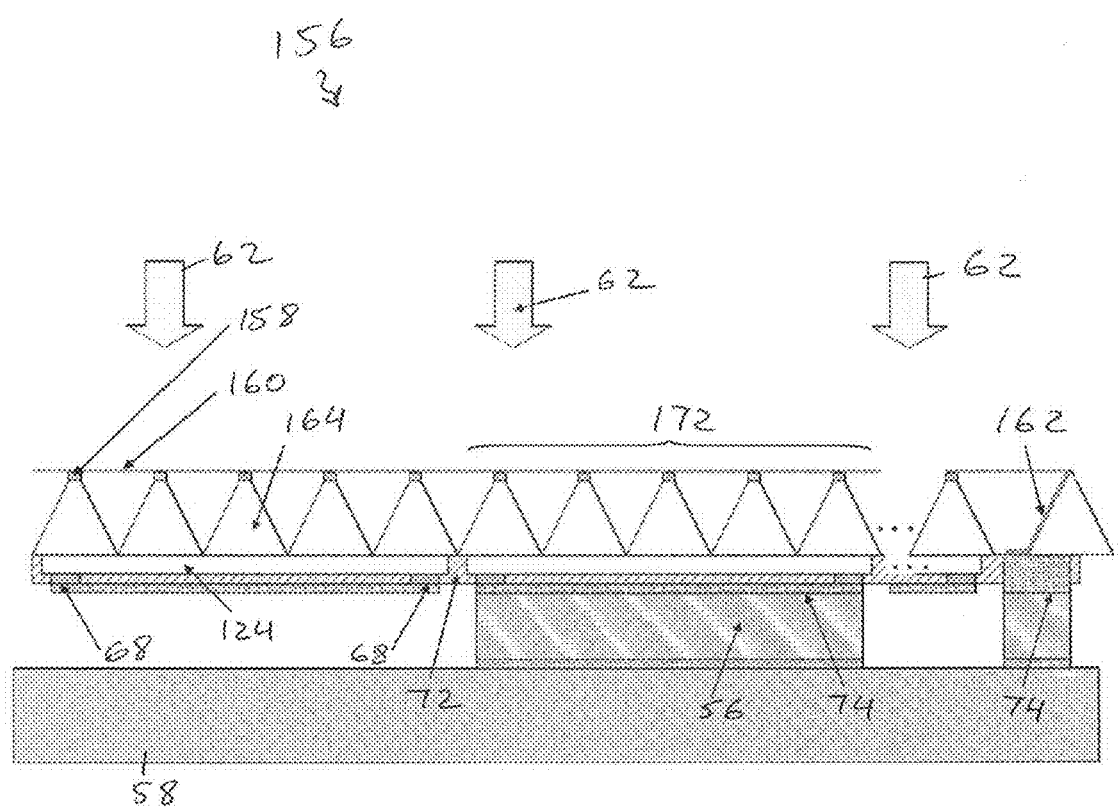
FIG. 17 depicts another exemplary embodiment of an optical imager according to the present disclosure.
Figure 18:
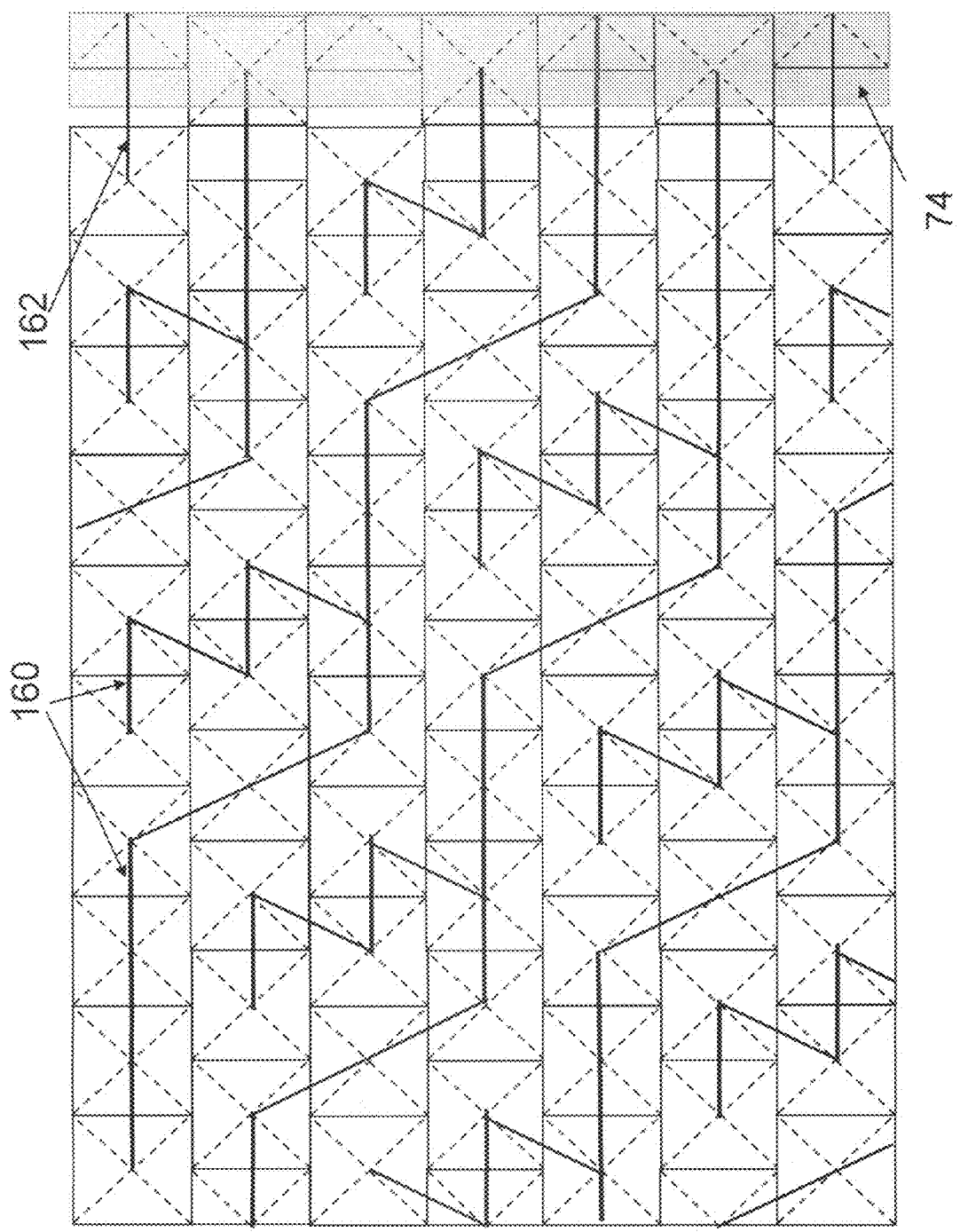
FIG. 18 depicts a top view of the optical imager shown in FIG. 17.

FIG. 17 depicts another exemplary embodiment of a novel detector array 156 according to the present disclosure that has its common electrical contacts 158 formed on the tops of the pyramids instead of on the back side of the detector array as discussed above. The fabrication process for this detector array is similar to the fabrication process for the other detector arrays. However, after the carrier substrate is removed, the planarization/fill material is etched to expose the tops of the pyramids. Metal ohmic contacts are then deposited and patterned over those exposed tops. Then, strips of metal interconnects 160 are deposited and patterned to interconnect the tips of the pyramids to the periphery of the detector array through the metal 162. Finally, the planarization/fill material can be removed, if desired, and a thin layer of a dielectric passivation can be deposited to cover the pyramids. Because the metal interconnect strips cover only a small portion of the top surface, most of the incident light 62 can reach the absorbers 164 and become absorbed. In one exemplary embodiment, the strips of top-side metal interconnect 160 do not form a rectangular grid as the rectangular grid may make the detector array 156 sensitive to the polarization of the incident light 62. In another exemplary embodiment, pattern of short strips of metal interconnects 160 is applied as shown in FIG. 18.

Figure 19:
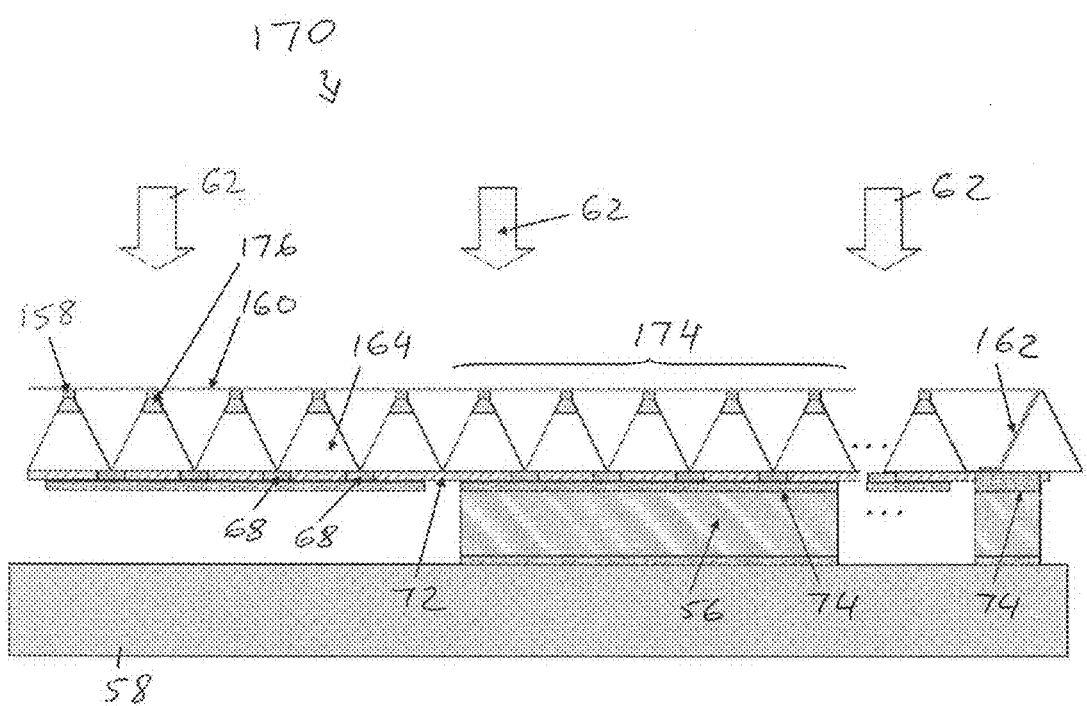
FIG. 19 depicts another exemplary embodiment of an optical imager according to the present disclosure.

FIG. 19 depicts another exemplary embodiment of a novel detector array 170 according to the present disclosure that has its common electrical contacts 158 and extractors 176 formed on the tops of the pyramids instead of on the back side of the detector array as discussed above. The strips of metal interconnects 160 are deposited and patterned to interconnect the tips of the pyramids to the periphery of the detector array through the metal 162. Because the metal interconnect strips 160 cover only a small portion of the top surface, most of the incident light 62 can reach the absorbers 164 and become absorbed. In one exemplary embodiment, the strips of top-side metal interconnect 160 do not form a rectangular grid as the rectangular gild may make the detector array 170 sensitive to the polarization of the incident light 62. As discussed above and shown in FIG. 12b, the slopes of the pyramids of the detector array 170 may also be covered by a surface-passivation layer 73 (not shown in FIG. 19) to prevent dark current due to surface states and carrier recombination at those surface states. Although fabrication process discussed above with reference to FIGS. 9a-9l is suitable for fabricating the detector array 170, it is to be understood that, when fabricating the detector array 170, the absorbing layer 88 is to be grown before the extractor layer 86.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A detector comprising:
   an extractor layer;
   an absorber layer disposed adjacent to the extractor layer;
   a first electrical contact; and
   a second electrical contact,
   wherein the absorber layer is configured to absorb photons of incident light and generate minority electrical carriers and majority electrical carriers;
   wherein the top surface of the absorber layer is shaped as a pyramid, the extractor layer is electrically connected with the absorber layer and with the first electrical contact for extracting the minority electrical carriers, and the absorber layer is electrically connected with the extractor layer and with the second electrical contact to extract the majority electrical carriers.

2. The detector of claim 1, wherein the absorber layer is disposed above the extractor layer.

3. The detector of claim 2, further comprising a base layer disposed between the extractor layer and the absorber layer, wherein the base layer is composed of the same material as the absorber layer.

4. The detector of claim 1, wherein the height of the pyramid is 50% or more of the height of the absorber layer.

5. The detector of claim 1, further comprising a read-out integrated circuit configured to process signals from the first electrical contact and the second electrical contact.

6. The detector of claim 2, further comprising a metal pad adjacent to the extractor layer, wherein the metal pad is configured to reflect incident light into the absorber layer.

7. The detector of claim 6 further comprising, dielectric buffer separating the absorber layer and the metal pad.

8. The detector of claim 1, Wherein the top surface of the absorber layer is shaped as a plurality of pyramids disposed adjacent to each other.

9. The detector of claim 8, further comprising a plurality of extractor layers, wherein each pyramid in the plurality of pyramids is disposed directly above one of the extractor layers in the plurality of the extractor layers.

10. The detector of claim 9, further comprising a plurality of electrically interconnected contacts, wherein each contact in the plurality of electrically interconnected contacts is electrically connected with one of the extractor layers in the plurality of the extractor layers.

11. The detector of claim 1, wherein the extractor layer is disposed above the absorber layer.

12. The detector of claim 1, wherein the extractor layer is an apex of the pyramid.

13. The detector of claim 12, wherein the first electrical contact is disposed above the extractor.

14. The detector of claim 1, wherein the second electrical contact is an apex of the pyramid.

15. The detector of claim 1, wherein shape of the pyramid's base is square, rectangular, hexagon, triangular, circular, or elliptical.

16. The detector of claim 1, wherein the absorber layer comprises lightly doped n-type material or p-type material.

17. The detector of claim 1, wherein the extractor layer comprises p-type material and the absorber layer comprises n-type material, or the extractor layer comprises n-type material and the absorber layer comprises p-type material.

18. The detector of claim 1, wherein the bottom surface of the absorber layer is shaped as a second pyramid.

19. The detector of claim 18, wherein the height of the pyramid is different from the height of the second pyramid.

20. The detector of claim 8, wherein the bottom surface of the absorber layer is shaped as a second plurality of pyramids disposed adjacent to each other.

21. The detector of claim 13, further comprising a top electrical interconnect electrically connected with the first electrical contact, wherein the top electrical interconnect defines openings that pass a substantial portion of photons of incident light to the absorber layer.

22. The detector of claim 14, further comprising a top electrical interconnect electrically connected with the second electrical contact, wherein the top electrical interconnect defines openings that pass a substantial portion of photons of incident light to the absorber layer.

23. The detector of claim 1, further comprising a passivation layer substantially covering the surface of the absorber layer, wherein the passivation layer is configured to prevent dark current due to surface states and carrier recombination at those surface states.

24. The detector of claim 8, wherein the bases of the pyramids in the plurality of pyramids are at a predetermined distance from each other.

25. The detector of claim 8, wherein the bases of the pyramids in the plurality of pyramids are configured to provide a path between the pyramids for the flow of the minority electrical carriers and/or the majority electrical carriers generated by the absorber layer.

26. The detector of claim 8, the second electrical contact is disposed between two of the adjacent pyramids in the plurality of pyramids.

27. A method of detecting incident light, the method comprising:
   providing an absorber layer shaped as a pyramid and configured to reduce reflection of an incident light and absorb the photons of the incident light and generate minority electrical carriers and majority electrical carriers; and
   providing an extractor layer for extracting the minority electrical carriers.

28. A method of manufacturing a detector, the method comprising:
   providing a substrate;
   forming an extractor layer above the substrate;
   forming an absorber layer above the extractor layer;
   etching the absorber layer to form one or more pyramidal shapes;
   providing a carrier substrate;

joining the carrier substrate with the absorber layer;
removing the substrate;
patterning the extractor layer to a predetermined shape;
forming one or more first metal contacts electrically contacted with the extractor layer; and
forming one or more second metal contacts electrically contacted with the absorber layer.

29. A method claim 28, further comprising:
connecting the one or more first metal contacts and the one or more second metal contacts with a read-out integrated circuit; and
removing the carrier substrate.

* * * * *